(12) United States Patent
Kobayashi et al.

(10) Patent No.: US 10,265,830 B2
(45) Date of Patent: Apr. 23, 2019

(54) POLISHING METHOD AND POLISHING APPARATUS

(71) Applicant: EBARA CORPORATION, Tokyo (JP)

(72) Inventors: Yoichi Kobayashi, Tokyo (JP); Keita Yagi, Tokyo (JP); Masaki Kinoshita, Tokyo (JP); Yoichi Shiokawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 215 days.

(21) Appl. No.: 15/304,829

(22) PCT Filed: Apr. 10, 2015

(86) PCT No.: PCT/JP2015/061224
§ 371 (c)(1),
(2) Date: Oct. 17, 2016

(87) PCT Pub. No.: WO2015/163164
PCT Pub. Date: Oct. 29, 2015

(65) Prior Publication Data
US 2017/0190020 A1    Jul. 6, 2017

(30) Foreign Application Priority Data

Apr. 22, 2014 (JP) .................. 2014-087945

(51) Int. Cl.
*B24B 49/05* (2006.01)
*B24B 49/02* (2006.01)
(Continued)

(52) U.S. Cl.
CPC ............ *B24B 49/05* (2013.01); *B24B 37/013* (2013.01); *B24B 37/105* (2013.01); *B24B 37/32* (2013.01);
(Continued)

(58) Field of Classification Search
CPC ....... B24B 37/013; B24B 49/02; B24B 49/03; B24B 49/04; B24B 49/05; B24B 49/12; H01L 22/12; H01L 22/26
See application file for complete search history.

(56) References Cited

U.S. PATENT DOCUMENTS 8,834,229 B2 * 9/2014 David .................. B24B 37/013
356/448
9,352,440 B2 * 5/2016 David .................. B24B 37/013
(Continued)

FOREIGN PATENT DOCUMENTS

CN         1500290 A     5/2004
CN       101242931 A     8/2008
(Continued)

OTHER PUBLICATIONS

International Patent Application No. PCT/JP2015/061224; Int'l Search Report; dated Jun. 23, 2015; 2 pages.

*Primary Examiner* — Timothy V Eley
(74) *Attorney, Agent, or Firm* — Baker & Hostetler LLP

(57) ABSTRACT

The present invention relates to a polishing method and a polishing apparatus for polishing a substrate such as a wafer while measuring a film thickness based on optical information included in reflected light from the substrate. The polishing method includes preparing a plurality of spectrum groups each containing a plurality of reference spectra corresponding to different film thicknesses; directing light to a substrate and receiving reflected light from the substrate; producing, from the reflected light, a sampling spectrum for selecting a spectrum group; selecting a spectrum group containing a reference spectrum which is closest in shape to the sampling spectrum; producing a measurement spectrum for obtaining a film thickness while polishing the substrate; selecting, from the selected spectrum group, a reference spectrum which is closest in shape to the measurement
(Continued)

spectrum that has been produced when the substrate is being polished; and obtaining a film thickness corresponding to the selected reference spectrum.

15 Claims, 19 Drawing Sheets

(51) Int. Cl.
    *B24B 49/04*     (2006.01)
    *B24B 37/013*     (2012.01)
    *B24B 37/34*     (2012.01)
    *B24B 49/12*     (2006.01)
    *B24B 49/03*     (2006.01)
    *H01L 21/67*     (2006.01)
    *H01L 21/66*     (2006.01)
    *B24B 37/10*     (2012.01)
    *B24B 37/32*     (2012.01)

(52) U.S. Cl.
    CPC .............. *B24B 37/34* (2013.01); *B24B 49/02* (2013.01); *B24B 49/03* (2013.01); *B24B 49/04* (2013.01); *B24B 49/12* (2013.01); *H01L 21/67* (2013.01); *H01L 22/12* (2013.01); *H01L 22/26* (2013.01)

(56) References Cited

U.S. PATENT DOCUMENTS

| | | | |
|---|---|---|---|
| 9,999,955 B2 * | 6/2018 | Kobayashi | ............ B24B 37/013 |
| 2010/0120331 A1 | 5/2010 | Carlsson et al. | |
| 2012/0021672 A1 | 1/2012 | David et al. | |
| 2012/0026492 A1 | 2/2012 | Zhang et al. | |
| 2012/0028813 A1 | 2/2012 | Qian et al. | |
| 2013/0273814 A1 | 10/2013 | Kobayashi et al. | |

FOREIGN PATENT DOCUMENTS

| | | |
|---|---|---|
| CN | 103155110 A | 6/2013 |
| EP | 1176631 A1 | 1/2002 |
| JP | 2002-359217 A | 12/2002 |
| JP | 2008-503356 A | 2/2008 |
| JP | 2012-508452 A | 4/2012 |
| JP | 2013-532912 A | 8/2013 |
| JP | 2013-222856 A | 10/2013 |
| JP | 2013-541827 A | 11/2013 |
| TW | 201212114 A | 3/2012 |
| WO | WO 2005/123335 A1 | 12/2005 |
| WO | WO 2008/032753 A1 | 3/2008 |
| WO | WO 2010/053804 A2 | 5/2010 |

* cited by examiner

POLISHING METHOD AND POLISHING APPARATUS

CROSS-REFERENCE TO RELATED APPLICATION

This application claims priority to Japanese Patent Application No. 2014-087945 filed on Apr. 22, 2014. The entire disclosure of Japanese Patent Application No. 2014-087945 filed on Apr. 22, 2014 is incorporated herein by reference in its entirety.

This application is a Section 371 National Stage Application of International Application No. PCT/JP2015/061224, filed on Apr. 10, 2015, entitled "POLISHING METHOD AND POLISHING APPARATUS", which claims priority to Japanese Application No. 2014-087945, filed on Apr. 22, 2014, incorporated herein by reference in their entirety.

TECHNICAL FIELD

The present invention relates to a polishing method and a polishing apparatus for polishing a substrate, such as a wafer or the like, while measuring a film thickness thereof on the basis of optical information contained in reflected light from the substrate.

BACKGROUND ART

In the manufacturing process of semiconductor devices, a polishing apparatus, or more specifically a CMP (Chemical Mechanical Polishing) apparatus, has been widely used for polishing a surface of a wafer. Generally, the CMP apparatus is provided with a film-thickness measuring device for measuring a film thickness of a wafer while the wafer is being polished. The CMP apparatus is configured to measure the film thickness while polishing the wafer, and detect a polishing endpoint of the wafer or control a distribution of remaining film thickness in the wafer surface on the basis of the measured values of the film thickness. The film thickness, which is to be measured by the CMP apparatus, is a thickness of an uppermost film which is an object of polishing. In this specification, "film thickness" shall represent "thickness of a film as an object of polishing" unless otherwise specified.

An optical film-thickness measuring device is known as an example of the film-thickness measuring device. This optical film-thickness measuring device is configured to emit light to a surface of a wafer, receive reflected light from the wafer, and determine a film thickness of the wafer from a spectrum of the reflected light. The spectrum of the reflected light changes in accordance with the film thickness of the wafer. Therefore, the optical film-thickness measuring device is able to determine the film thickness based on the spectrum.

CITATION LIST

Patent Literature

Patent document 1: Japanese laid-open patent publication No. 2008-503356

Patent document 2: International Patent Publication No. WO2008/032753

SUMMARY OF INVENTION

Technical Problem

However, even when the film to be polished is under the same film thickness condition, the spectrum of the reflected light may vary due to structural variation of an underlying layer lying beneath the film. For example, the spectrum of the reflected light varies depending on a depth and a width of a recess formed in the underlying layer. FIG. 19 is a cross-sectional view showing a surface structure of a wafer. A film 100 (e.g., an $SiO_2$ film), which forms an exposed surface of the wafer, is formed on an underlying layer 101 (e.g., a silicon layer). The underlying layer 101 has a recess 103 formed therein which is filled with a portion of the film 100. A reference symbol t1 represents a thickness of the film 100, a reference symbol t2 represents a depth of the recess 103, a reference symbol d2 represents a width of the recess 103, and a reference symbol d1 represents a width of a portion, other than the recess 103, of the underlying layer 101.

FIG. 20 is a diagram showing a spectrum of reflected light that varies in accordance with the depth t2 of the recess 103. In FIG. 20, a vertical axis represents a reflectance of light (or a relative reflectance with respect to reflected light from a silicon wafer when being water-polished), and a horizontal axis represents wavelength of light. The spectrum shown in FIG. 20 was obtained from a simulation of light reflection which was carried out under the condition that the depth t2 of the recess 103 was varied gradually while the thickness t1 of the film 100 and a ratio of the width d2 to the width d1 were not varied. It can be seen from FIG. 20 that, even if the thickness t1 of the film 100 remains the same, the spectrum of the reflected light is shifted as the depth t2 of the recess 103 is varied.

FIG. 21 is a diagram showing the spectrum of reflected light that varies in accordance with the width d2 of the recess 103. The spectrum shown in FIG. 21 was obtained from a simulation of light reflection which was carried out under the condition that the width d2 of the recess 103 (more specifically, the ratio of the width d2 to the width d1) was varied gradually while the thickness t1 of the film 100 and the depth t2 of the recess 103 were not varied. It can be seen from FIG. 21 that, even if the thickness t1 of the film 100 remains the same, the spectrum of the reflected light is shifted as the width d2 of the recess 103 is varied.

An actual wafer comprises multilayered structure composed of films and interconnects. In many cases, it is necessary to control a thickness of a film being polished (or a film on a raised portion of an underlying layer in a case where the underlying layer has a recess portion and such a raised portion) during the polishing process at each stage of the manufacturing process. In this specification, various layers that lie underneath the film to be polished shall be collectively referred to as "underlying layer".

It is an object of the present invention to provide a polishing method and a polishing apparatus which are capable of measuring an accurate film thickness while eliminating an influence of structural variation of an underlying layer.

Solution to Problem

According to an aspect of the present invention, there is provided a polishing method comprising: preparing a plurality of spectrum groups each containing a plurality of reference spectra corresponding to different film thicknesses; directing light to a substrate and receiving reflected light from the substrate; producing, from the reflected light, a sampling spectrum for selecting a spectrum group; selecting a spectrum group containing a reference spectrum which is closest in shape to the sampling spectrum; producing a measurement spectrum for obtaining a film thickness while polishing the substrate; selecting, from the selected spectrum group, a reference spectrum which is closest in shape to the measurement spectrum that has been produced when the substrate is being polished; and obtaining a film thickness corresponding to the selected reference spectrum.

According to another aspect of the present invention, there is provided a polishing method comprising: obtaining at least one spectrum group containing a plurality of reference spectra by polishing a reference substrate; correcting the plurality of reference spectra such that a polishing rate of the reference substrate is regarded as constant, thereby obtaining a plurality of corrected reference spectra corresponding to different film thicknesses; directing light to a substrate and receiving reflected light from the substrate; producing a measurement spectrum for obtaining a film thickness while polishing the substrate; selecting, from the at least one spectrum group, a corrected reference spectrum which is closest in shape to the measurement spectrum that has been produced when the substrate is being polished; and obtaining a film thickness corresponding to the corrected reference spectrum selected.

According to still another aspect of the present invention, there is provided a polishing apparatus comprising: a polishing table for supporting a polishing pad thereon; a polishing head configured to press a substrate against the polishing and polish the substrate; a storage device storing therein a plurality of spectrum groups each containing a plurality of reference spectra corresponding to different film thicknesses; and an optical film-thickness measuring device configured to obtain a film thickness of the substrate, the optical film-thickness measuring device being configured to: direct light to the substrate and receive reflected light from the substrate; produce, from the reflected light, a sampling spectrum for selecting a spectrum group; select a spectrum group containing a reference spectrum which is closest in shape to the sampling spectrum; produce a measurement spectrum for obtaining a film thickness while the substrate is being polished; select, from the selected spectrum group, a reference spectrum which is closest in shape to the measurement spectrum that has been produced when the substrate is being polished; and obtain a film thickness corresponding to the selected reference spectrum.

Advantageous Effects of Invention

According to the present invention, an influence of a difference in structure of an underlying layer can be eliminated by selecting a spectrum group containing a reference spectrum which is closest in shape to the sampling spectrum. As a consequence, it is possible to acquire a more accurate film thickness.

DESCRIPTION OF EMBODIMENTS

Figure 1:
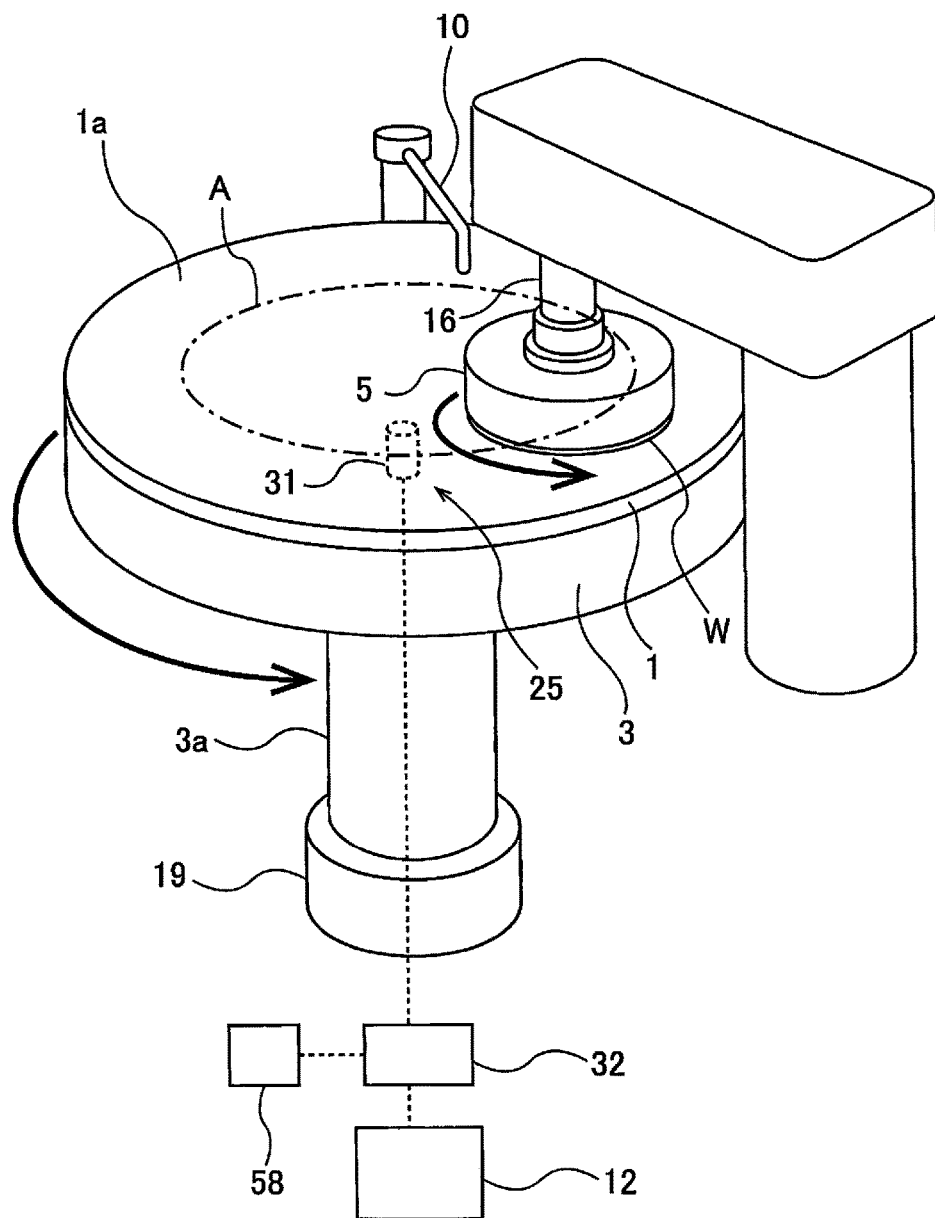
FIG. 1 is a view showing a polishing apparatus according to an embodiment of the present invention.

Embodiments of the present invention will be described below with reference to the drawings. FIG. 1 is a view showing a polishing apparatus according to an embodiment of the present invention. As shown in FIG. 1, the polishing apparatus includes a polishing table 3 to which a polishing pad 1 having a polishing surface 1a is attached, a polishing head 5 for holding a wafer W, which is an example of a substrate, and polishing the wafer W while pressing it against the polishing pad 1 on the polishing table 3, a polishing-liquid supply nozzle 10 for supplying a polishing liquid (e.g., a slurry) onto the polishing pad 1, and a polishing controller 12 for controlling polishing of the wafer W.

The polishing table 3 is coupled to a table motor 19 through a table shaft 3a. The table motor 19 is disposed below the polishing table 3, and is configured to rotate the polishing table 3 in a direction indicated by arrow. The polishing pad 1 is attached to an upper surface of the polishing table 3. The polishing pad 1 has an upper surface serving as a polishing surface 1a for polishing the wafer W. The polishing head 5 is coupled to a lower end of a polishing head shaft 16. The polishing head 5 is configured to be able to hold the wafer W on its lower surface by vacuum suction. The polishing head shaft 16 can be moved up and down by an elevating mechanism which is not shown.

Polishing of the wafer W is performed as follows. The polishing head 5 and the polishing head 3 are rotated individually in directions indicated by arrows, and the polishing-liquid supply nozzle 10 supplies the polishing liquid (or slurry) onto the polishing pad 1. While the polishing liquid is being supplied, the polishing head 5 presses the wafer W against the polishing surface 1a of the polishing pad 1. The surface of the wafer W is polished by a mechanical action of abrasive grains contained in the polishing liquid and a chemical action of the polishing liquid.

Figure 2:
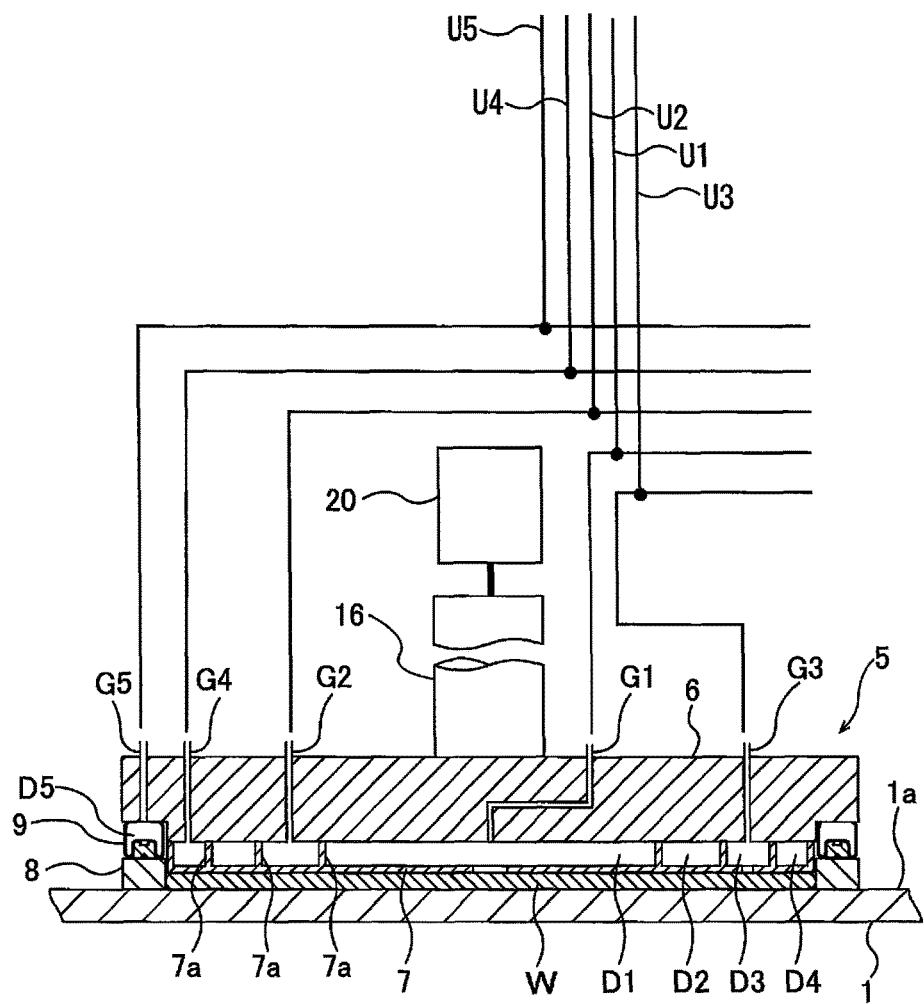
FIG. 2 is a cross-sectional view showing a detailed structure of a polishing head.

FIG. 2 is a cross-sectional view showing a detailed structure of the polishing head 5. The polishing head 5 includes a carrier 6 in the form of a circular plate, a circular flexible elastic membrane 7 which defines a plurality of pressure chambers D1, D2, D3, D4 beneath the carrier 6, and a retainer ring 8 for pressing the polishing pad 1. The retainer ring 8 is disposed around the wafer W. The pressure chambers D1, D2, D3, D4 are formed between the elastic membrane 7 and a lower surface of the carrier 6.

The elastic membrane 7 has a plurality of annular partition walls 7a, which isolate the pressure chambers D1, D2, D3, D4 from each other. The central pressure chamber D1 is of a circular shape, and the other pressure chambers D2, D3, D4 are annular in shape. The pressure chambers D1, D2, D3, D4 are in concentric arrangement. The polishing head 5 may have only one pressure chamber, or may have five or more pressure chambers.

The pressure chambers D1, D2, D3, D4 are coupled to fluid lines G1, G2, G3, G4, respectively, so that pressurized fluid (e.g., pressurized gas, such as pressurized air) having regulated pressure(s) is supplied through the fluid lines G1, G2, G3, G4 into the pressure chambers D1, D2, D3, D4. Vacuum lines U1, U2, U3, U4 are coupled to the fluid lines G1, G2, G3, G4, respectively, so that negative pressures can be created in the pressure chambers D1, D2, D3, D4 by the vacuum lines U1, U2, U3, U4. The internal pressures in the pressure chambers D1, D2, D3, D4 can be varied independently of each other for thereby independently regulating polishing pressures on corresponding four areas of the wafer W, i.e., a central area, an inner intermediate area, an outer intermediate area, and a peripheral area.

An annular elastic membrane 9 is disposed between the retainer ring 8 and the carrier 6. An annular pressure chamber D5 is formed in this elastic membrane 9. The pressure chamber D5 is coupled to a fluid line G5, so that pressurized fluid (e.g., pressurized air) having regulated pressure can be supplied through the fluid line G5 into the pressure chamber D5. A vacuum line U5 is coupled to the fluid line G5 so that a negative pressure can be created in the pressure chamber D5 by the vacuum line U5. As the pressure in the pressure chamber D5 changes, the entirety of the retainer ring 8 can move up and down. The pressure in the pressure chamber D5 is applied to the retainer ring 8, which is in turn able to directly press the polishing pad 1 independently of the elastic membrane 7. When the wafer W is being polished, the retainer ring 8 presses the polishing pad 1 around the wafer W, and the elastic membrane 7 presses the wafer W against the polishing pad 1.

The carrier 6 is fixed to a lower end of the head shaft 16, which is coupled to an elevating mechanism 20. This elevating mechanism 20 is configured to elevate and lower the head shaft 16 and the polishing head 5, and to position the polishing head 5 at a predetermined height. The elevating mechanism 20, which functions as a polishing-head positioning mechanism, may comprise a combination of a servomotor and a ball screw mechanism.

While the elevating mechanism 20 positions the polishing head 5 at the predetermined height, the pressure chambers D1 through D5 are supplied with the pressurized fluid. Upon receiving the pressures in the pressure chambers D1 through D4, the elastic membrane 7 presses the wafer W against the polishing pad 1. Upon receiving the pressure in the pressure chamber D5, the retainer ring 8 presses the polishing pad 1. The wafer W is polished in this state.

The polishing apparatus includes an optical film-thickness measuring device 25 for obtaining a film thickness of the wafer W. This optical film-thickness measuring device 25 has a film thickness sensor 31 for obtaining an optical signal that varies in accordance with the film thickness of the wafer W, and a processor 32 for determining the film thickness from the optical signal. The film thickness sensor 31 is disposed in the polishing table 3, and the processor 32 is coupled to the polishing controller 12. The film thickness sensor 31 rotates together with the polishing table 3 as indicated by arrow A, and obtains the optical signal of the wafer W held on the polishing head 5. The film thickness sensor 31 is coupled to the processor 32 so that the optical signal, obtained by the film thickness sensor 31, is sent to the processor 32.

Figure 3:
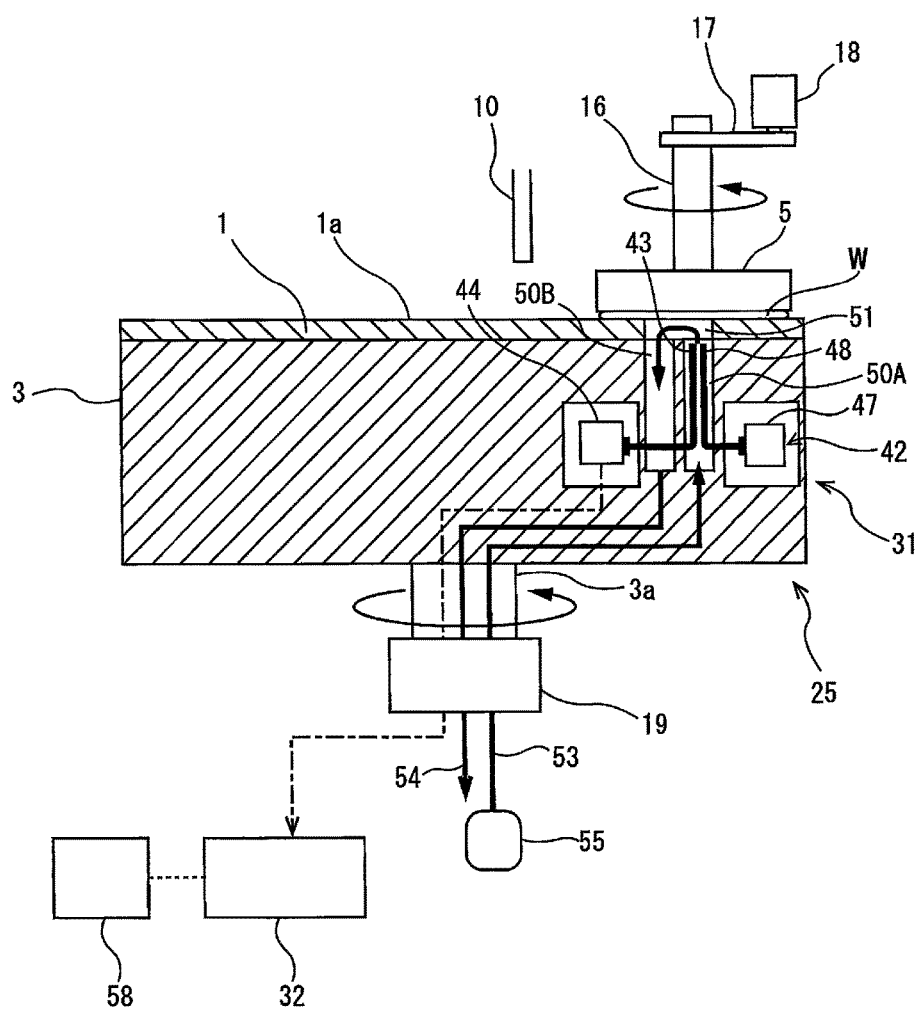
FIG. 3 is a schematic cross-sectional view showing the polishing apparatus including an optical film-thickness measuring device.

FIG. 3 is a schematic cross-sectional view showing the polishing apparatus having the optical film-thickness measuring device 25. The polishing head shaft 16 is coupled to a polishing head motor 18 through a coupling device 17, such as belt, so that the polishing head shaft 16 is rotated by the polishing head motor 18. This rotation of the polishing head shaft 16 is transmitted to the polishing head 5 to rotate the polishing head 5 in the direction indicated by the arrow.

As described previously, the optical film-thickness measuring device 25 includes the film thickness sensor 31 and the processor 32. The film thickness sensor 31 is configured to emit light to the surface of the wafer W, receive the light reflected from the wafer W, and break up the reflected light according to wavelength. The film thickness sensor 31 includes an light emitter 42 for irradiating the surface, to be polished, of the wafer W with the light, an optical fiber 43 as a light receiver for receiving the reflected light from the wafer W, a spectrometer 44 configured to resolve the reflected light according to wavelength and measure intensity of the reflected light over a predetermined wavelength range.

The polishing table 3 has a first hole 50A and a second hole 50B having upper open ends lying in the upper surface of the polishing table 3. The polishing pad 10 has a through-hole 51 at a position corresponding to the holes 50A and 50B. The holes 50A and 50B are in fluid communication with the through-hole 51, which has an upper open end lying in the polishing surface 1a. The first hole 50A is coupled to a liquid supply source 55 via a liquid supply passage 53 and a rotary joint (not shown). The second hole 50B is coupled to a liquid discharge passage 54.

The light emitter 42 includes a light source 47 for emitting multiwavelength light and an optical fiber 48 coupled to the light source 47. The optical fiber 48 is an optical transmission element for transmitting the light, emitted by the light source 47, to the surface of the wafer W. The distal ends of the optical fiber 48 and the optical fiber 43 lie in the first hole 50A and are located near the surface, to be polished, of the wafer W. The distal ends of the optical fiber 48 and the optical fiber 43 are arranged so as to face the wafer W held by the polishing head 5, so that multiple areas of the wafer W are irradiated with the light each time the polishing table 3 makes one revolution.

Preferably, the distal ends of the optical fiber 48 and the optical fiber 43 are located so as to pass across the center of the wafer W held by the polishing head 5.

During polishing of the wafer W, the liquid supply source 55 supplies water (preferably pure water) as a transparent liquid into the first hole 50A through the liquid supply passage 53. The water fills a space formed between the lower surface of the wafer W and the distal ends of the optical fibers 48, 43. The water further flows into the second hole 50B and is expelled therefrom through the liquid discharge passage 54. The polishing liquid is discharged together with the water and thus a path of light is ensured. The liquid supply passage 53 is provided with a valve (not shown in the drawing) configured to operate in conjunction with the rotation of the polishing table 3. The valve operates so as to stop the flow of the water or reduce the flow of the water when the wafer W is not located over the through-hole 51.

The optical fiber 48 and the optical fiber 43 are arranged in parallel with each other. The distal ends of the optical fiber 48 and the optical fiber 43 are perpendicular to the surface of the wafer W, so that the optical fiber 48 casts the light onto the surface of the wafer W perpendicularly.

During polishing of the wafer W, the light emitter 42 directs the light to the wafer W, and the optical fiber (or the light receiver) 43 receives the light reflected from the wafer W. The spectrometer 44 measures the intensity of the reflected light at each of the wavelengths over the predetermined wavelength range and sends light intensity data to the processor 32. The light intensity data is the optical signal reflecting the film thickness of the wafer W, and contains intensities of the reflected light and corresponding wavelengths. The processor 32 produces a spectrum showing the light intensities at the respective wavelengths from the light intensity data, and further determines the film thickness of the wafer W from the spectrum.

Figure 4:
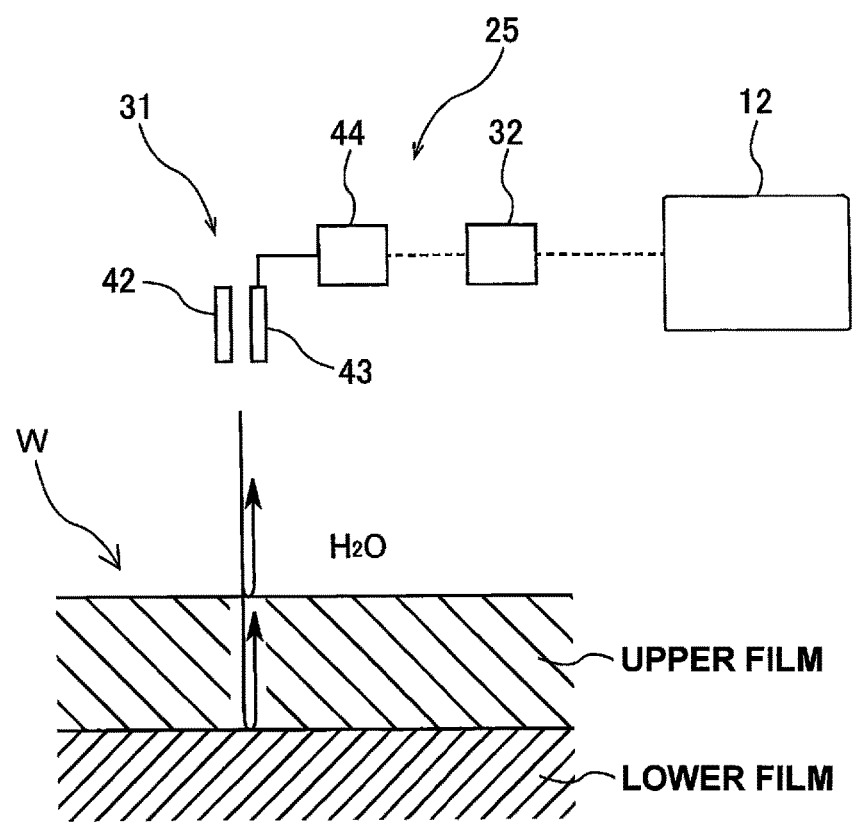
FIG. 4 is a schematic diagram illustrative of the principle of the optical film-thickness measuring device.
Figure 5:
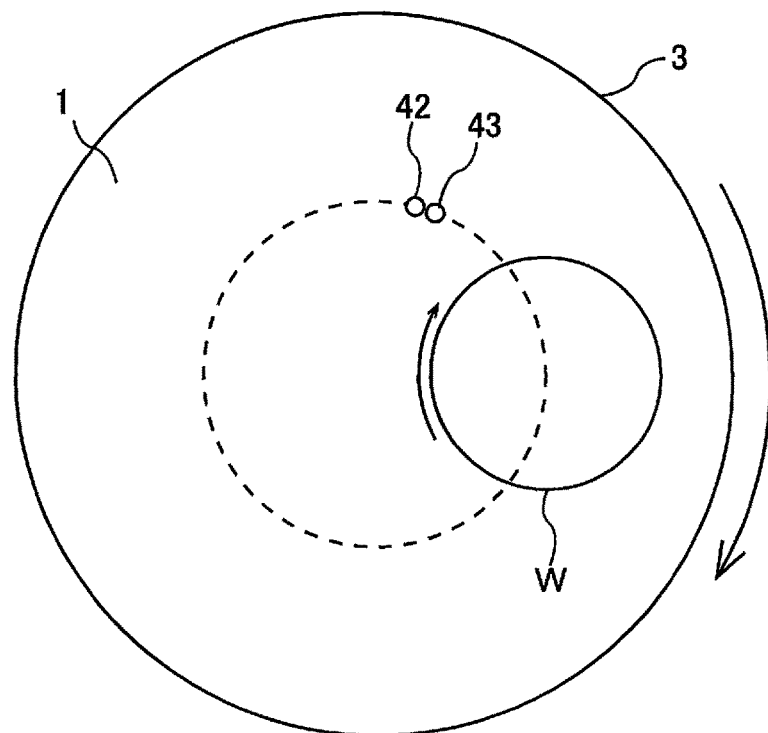
FIG. 5 is a plan view showing a positional relationship between a wafer and a polishing table.

FIG. 4 is a schematic view illustrating the principle of the optical film-thickness measuring device 25, and FIG. 5 is a plan view showing a positional relationship between the wafer W and the polishing table 3. In this example shown in FIG. 4, the wafer W has a lower film and an upper film formed on the lower film. The upper film is, for example, a silicon layer or a dielectric film. The light emitter 42 and the light receiver 43 are oriented toward the surface of the wafer W. The light emitter 42 is configured to direct the light to multiple areas, including the center, of the wafer W each time the polishing table 3 makes one revolution.

The light, which is cast on the wafer W, is reflected off an interface between a medium (e.g., water in the example of FIG. 4) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the wafer, varies according to the thickness of the upper film. The spectrometer 44 breaks up the reflected light according to the wavelength and measures the intensity of the reflected light at each of the wavelengths. The processor 32 produces the spectrum from the intensity data of the reflected light (i.e., the optical signal) obtained from the spectrometer 44.

Hereinafter, a spectrum produced from the reflected light from the wafer W to be polished will be referred to as measurement spectrum. This measurement spectrum is expressed as a line graph (i.e., a spectral waveform) indicating a relationship between the wavelength and the intensity of the light. The intensity of the light can also be expressed as a relative value, such as a reflectance or a relative reflectance.

Figure 6:
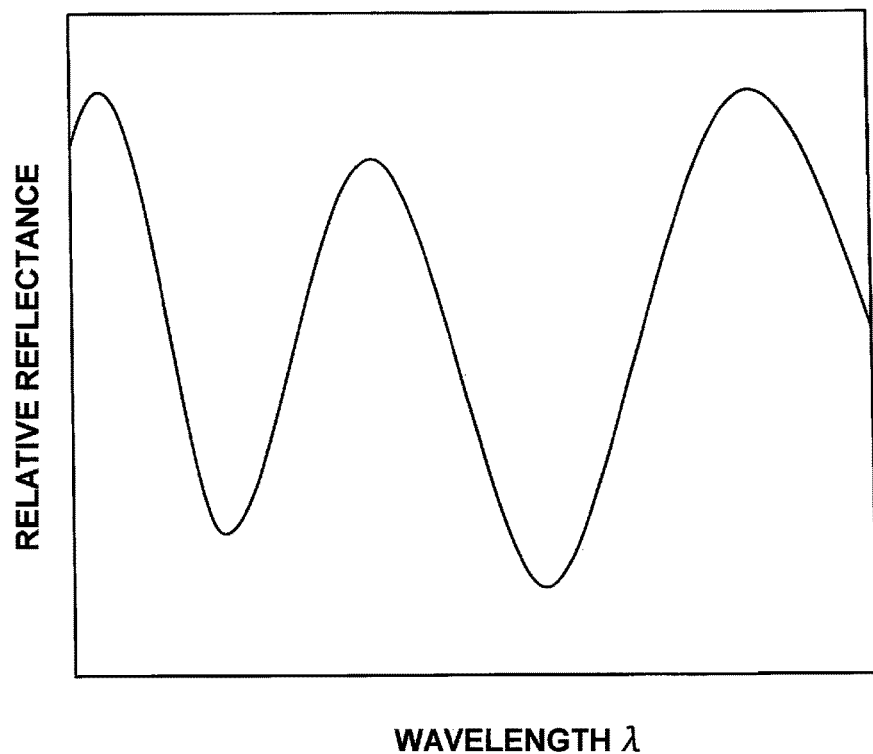
FIG. 6 is a diagram showing a spectrum produced by a processor.

FIG. 6 is a diagram showing a measurement spectrum created by the processor 32. In FIG. 6, horizontal axis represents the wavelength of the light reflected from the wafer, and vertical axis represents relative reflectance derived from the intensity of the reflected light. The relative reflectance is an index that represents reflection intensity of light. More specifically, the relative reflectance is a ratio of the intensity of the light to a predetermined reference intensity. By dividing the intensity of the light (i.e., the actually measured intensity) by a predetermined reference intensity at each of the wavelengths, unwanted noises, such as a variation in the intensity inherent in an optical system or the light source, are removed from the actually measured intensity. As a result, a measurement spectrum reflecting only the film thickness information can be obtained.

The reference intensity is an intensity obtained in advance at each of the wavelengths. The relative reflectance is calculated at each of the wavelengths. More specifically, the relative reflectance is determined by dividing the intensity of the light (i.e., the actually measured intensity) at each of the wavelengths by a corresponding reference intensity. The reference intensity may be an intensity of light from a silicon wafer (bare wafer) with no film thereon which is being water-polished in the presence of water. In the actual polishing process, the relative reflectance is obtained as follows. A dark level (which is a background intensity obtained under the condition that light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. Specifically, a relative reflectance $R(\lambda)$ can be calculated by using the following equation (1).

[EQUATION 1]

$$R(\lambda) = \frac{E(\lambda) - D(\lambda)}{B(\lambda) - D(\lambda)}$$

where $\lambda$ is wavelength, $E(\lambda)$ is the intensity of the light at the wavelength $\lambda$ reflected from the wafer, $B(\lambda)$ is the reference intensity at the wavelength $\lambda$, and $D(\lambda)$ is the background intensity (i.e., the dark level) at the wavelength $\lambda$ obtained under the condition that light is cut off.

Figure 7:
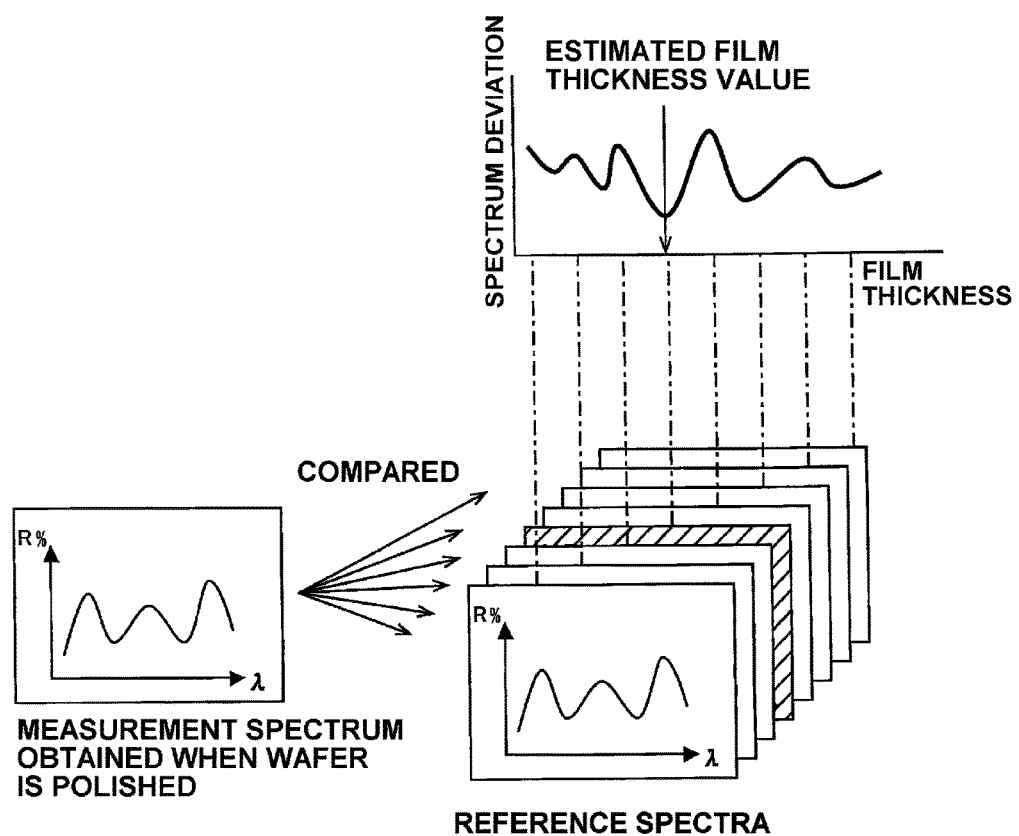
FIG. 7 is a diagram illustrative of a process of determining a film thickness from a comparison between a measurement spectrum obtained and a plurality of reference spectra.

The processor 32 is configured to determine the film thickness from a comparison between the measurement spectrum and a plurality of reference spectra. The optical film-thickness measuring device 25 is coupled to a storage device 58 show in FIG. 1 and FIG. 3. The plurality of reference spectra are stored in this storage device 58. FIG. 7 is a diagram illustrating a process of determining the film thickness from the comparison between the measurement spectrum and the plurality of reference spectra. The processor 32 compares the spectrum, which is produced when the wafer is being polished, with the plurality of reference spectra so as to determine a reference spectrum which is closest in shape to the measurement spectrum, and obtains a film thickness which has been associated with the determined reference spectrum. The reference spectrum which is closest in shape to the measurement spectrum is a spectrum with the smallest difference in the relative reflectance between the reference spectrum and the measurement spectrum.

The plurality of reference spectra are those obtained in advance by polishing a reference wafer having an initial film thickness which is the same as or equivalent to that of the wafer which is an object of polishing (which may be hereinafter referred to as target wafer or target substrate). Each reference spectrum can be associated with a film thickness at a point in time when that reference spectrum is obtained. Specifically, each reference spectrum is obtained at a different film thickness, and the plurality of reference spectra correspond to different film thicknesses. Therefore, the current film thickness can be estimated by identifying a reference spectrum whose shape is most similar to the shape of the measurement spectrum.

An example of a process of obtaining the plurality of reference spectra will be described below. First, a reference wafer having a film thickness, which is the same as or equivalent to that of a target wafer, is prepared. The reference wafer is transported to a not-shown film-thickness measuring unit, which then measures an initial film thickness of the reference wafer. Subsequently, the reference wafer is transported to the polishing apparatus shown in FIG. 1, where the reference wafer is polished while the slurry as the polishing liquid is supplied onto the polishing pad 1. During polishing of the reference wafer, as described previously, the light is directed to the surface of the reference wafer, and a spectrum (i.e., a reference spectrum) of reflected light from the reference wafer is obtained. The reference spectrum is obtained each time the polishing table 3 makes one revolution. Therefore, a plurality of reference spectra are obtained during the polishing process of the reference wafer. After the polishing process of the reference wafer is terminated, the reference wafer is transported again to the aforementioned film-thickness measuring unit, which then measures a film thickness (i.e., a final film thickness) of the polished reference wafer.

Figure 8:
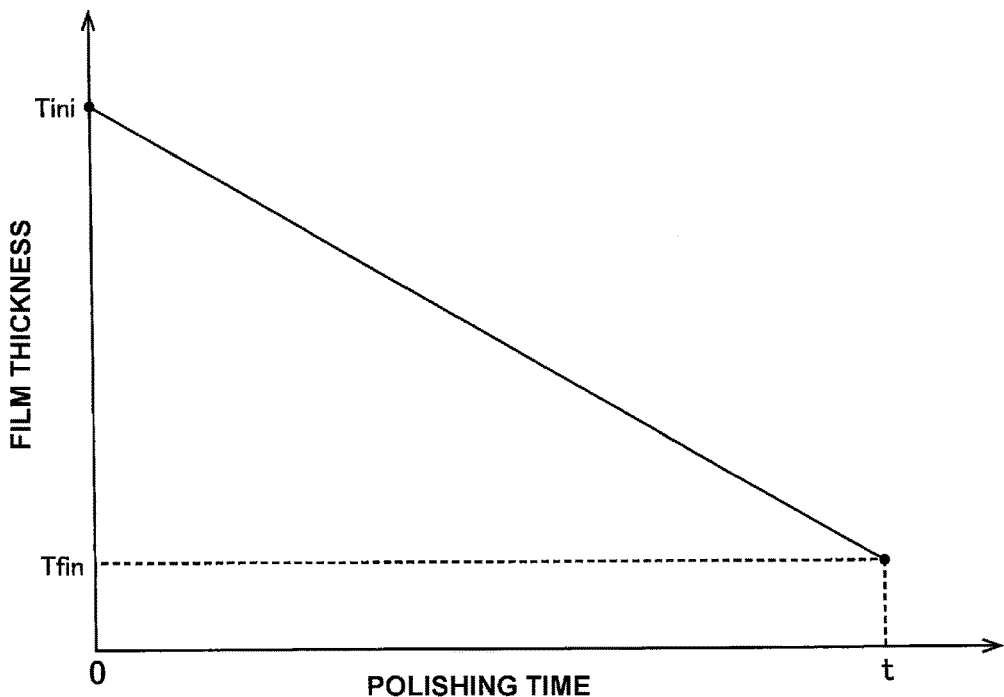
FIG. 8 is a graph showing a relationship between a film thickness of a reference wafer and a polishing time.

FIG. 8 is a graph showing a relationship between film thickness of the reference wafer and polishing time. If a polishing rate of the reference wafer is constant, as shown in FIG. 8, the film thickness linearly decreases with the polishing time. In other words, the film thickness can be expressed with use of a linear function which includes the polishing time as a variable. The polishing rate can be calculated by dividing a difference between the initial film thickness Tini and the final film thickness Tfin by the polishing time t at which the final film thickness Tfin is reached.

Since the reference spectrum is periodically obtained each time the polishing table 3 makes one revolution, a polishing time at which each reference spectrum was obtained can be calculated from a rotational speed of the polishing table 3. Alternatively, it is possible to more precisely measure a time from a point in time when polishing of the reference wafer is started until each reference spectrum is obtained. Furthermore, it is also possible to calculate a film thickness, corresponding to each reference spectrum, from a polishing time at which that reference spectrum was obtained. In this manner, a plurality of reference spectra corresponding respectively to different film thicknesses are obtained. Each reference spectrum can be associated (or connected) with a corresponding film thickness. Therefore, the processor 32 can identify a reference spectrum which is closest in shape to the measurement spectrum while a wafer is being polished, and can determine the current film thickness from a film thickness that has been associated with the identified reference spectrum.

If a cross-sectional structure of a wafer, to be polished, (i.e., a target wafer) is known, it is possible to obtain a plurality of reference spectra from a simulation of light reflection. This simulation is conducted by building or creating a structure of a target wafer in a computer and simulating a spectrum which is obtained when the target wafer is irradiated with light, while reducing the film thickness of the wafer gradually. In this manner, it is possible to obtain a plurality of reference spectra corresponding to different film thicknesses from the simulation on the computer.

Figure 20:
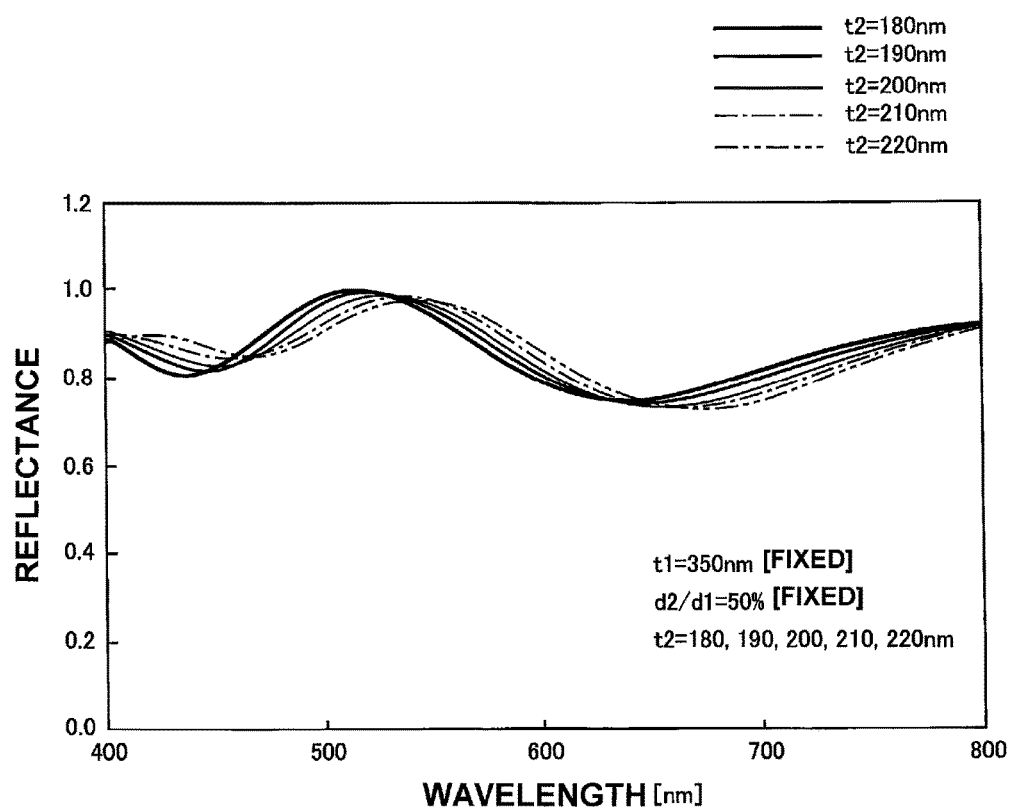
FIG. 20 is a diagram showing a spectrum of reflected light that varies according to a depth of a recess formed in an underlying layer.
Figure 21:
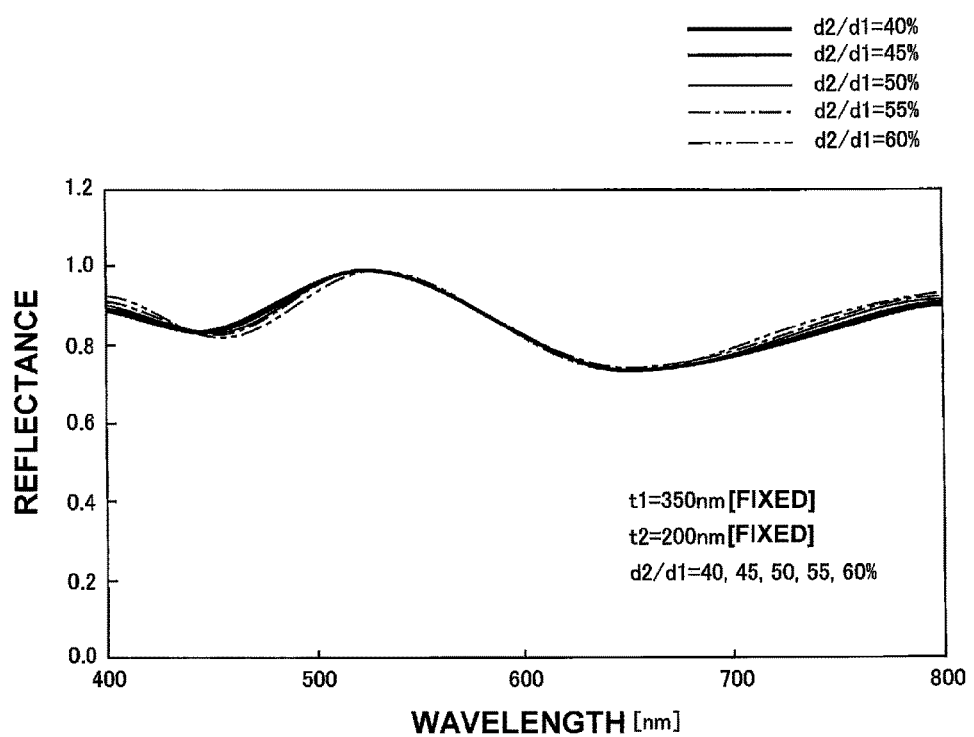
FIG. 21 is a diagram showing a spectrum of reflected light that varies according to a width of a recess formed in an underlying layer.

The spectrum of the reflected light varies in accordance with the film thickness. Consequently, if the film thickness remains unchanged, the spectrum also remains unchanged. However, as shown in FIG. 20 and FIG. 21, even if the film thickness is the same, the spectrum may change due to a difference in structure of an underlying layer existing beneath the film. The structure of the underlying layer may vary from area to area in the surface of the wafer, or may vary from wafer to wafer. Such a difference in the structure of the underlying layer prevents accurate measuring of the film thickness.

In order to eliminate an influence of such a change in the spectrum caused by the difference in the structure of the underlying layer, the processor 32 is configured to determine a film thickness using a plurality of spectrum groups each containing a plurality of reference spectra corresponding respectively to different film thicknesses. The processor 32 is coupled to the storage device 58 which stores the plurality of spectrum groups therein. The reference spectra contained in these different spectrum groups are either reference spectra produced from light reflected from different areas of the reference wafer, or reference spectra obtained using a plurality of reference wafers, or reference spectra obtained from a simulation of light reflection.

An example of a process of obtaining a plurality of spectrum groups will be described below. In this example, one reference wafer having a film thickness, which is the same as or equivalent to that of a target wafer, is used. The film thickness of the reference wafer may be larger than the film thickness of the target wafer. Given that the film thickness cannot accurately be determined during an initial polishing stage, the film thickness of the reference wafer may be slightly smaller than the film thickness of the target wafer. While the reference wafer is being polished, a plurality of areas, which have been defined on the reference wafer, are irradiated with the light. A plurality of reference spectra are produced from the light reflected from these areas, and the reference spectra produced are classified according to the areas, whereby a plurality of spectrum groups are obtained. The structure of the underlying layer varies slightly from area to area of the reference wafer. Therefore, a plurality of spectrum groups which reflect the difference in the structure of the underlying layer are obtained.

Another example of a process of obtaining a plurality of spectrum groups will be described below. In this example, a plurality of reference wafers each having a film thickness, which is the same as or equivalent to that of a target wafer, are used. The film thicknesses of the reference wafers may be larger than the film thickness of the target wafer. Given that the film thickness cannot accurately be determined during an initial polishing stage, the film thicknesses of the reference wafers may be slightly smaller than the film thickness of the target wafer. One reference wafer is selected from the plurality of reference wafers. While the selected reference wafer is being polished, the reference wafer is irradiated with the light, and a plurality of reference spectra are produced from the light reflected from the reference wafer, so that one or more spectrum groups are obtained. The process of irradiating the selected reference wafer with the light and the process of obtaining one or more spectrum groups are repeated, while changing the reference substrate, to be selected, from one to another each time the process of irradiating the reference wafer and the process of obtaining one or more spectrum groups are repeated, until all the reference wafers are polished, so that a plurality of spectrum groups are obtained. The structure of the underlying layer varies slightly between the reference wafers. Therefore, a plurality of spectrum groups which reflect the difference in the structure of the underlying layer are obtained. If the structure of the underlying layer is different not only between wafers but also between areas in a wafer surface, spectrum groups are obtained in a plurality of areas of each of the reference wafers.

While the target wafer is being polished, the target wafer is irradiated with the light as described above. The processor 32 produces a spectrum from the reflected light from the target wafer, and selects a spectrum group containing a reference spectrum which is closest in shape to the produced spectrum. This spectrum used to select a spectrum group will hereinafter be referred to as sampling spectrum. As with the measurement spectrum, the sampling spectrum is a spectrum produced from the light reflected from the wafer W to be polished. The comparison in shape between the sampling spectrum and the reference spectrum is performed on the basis of a deviation of the reference spectrum from the sampling spectrum. More specifically, the processor 32 calculates the deviation between these two spectra with use of the following equation.

[EQUATION 2]

$$U = \sum_{\lambda 1}^{\lambda 2} |Rc(\lambda) - Rp(\lambda)| \quad (2)$$

where λ represents a wavelength of light, λ1, λ2 represent upper limit and lower limit that determine a wavelength range of the spectrum to be monitored, Rc represents a relative reflectance that constitutes the sampling spectrum, and Rp represents a relative reflectance that constitutes the reference spectrum. In view of the influences of variations in the intensity of the reflected light and noise due to the in-situ measuring process of the film thickness during polishing of the wafer, preprocessing may be carried out on Rc and Rp. Examples of such preprocessing may include a normalizing process wherein each of Rc and Rp is divided by an average wavelength, an averaging process wherein values of Rc and Rp and those in an adjacent measuring area are averaged, and a time-averaging process wherein the measured value of Rc and Rp and those in several steps in the past are averaged.

Figure 9:
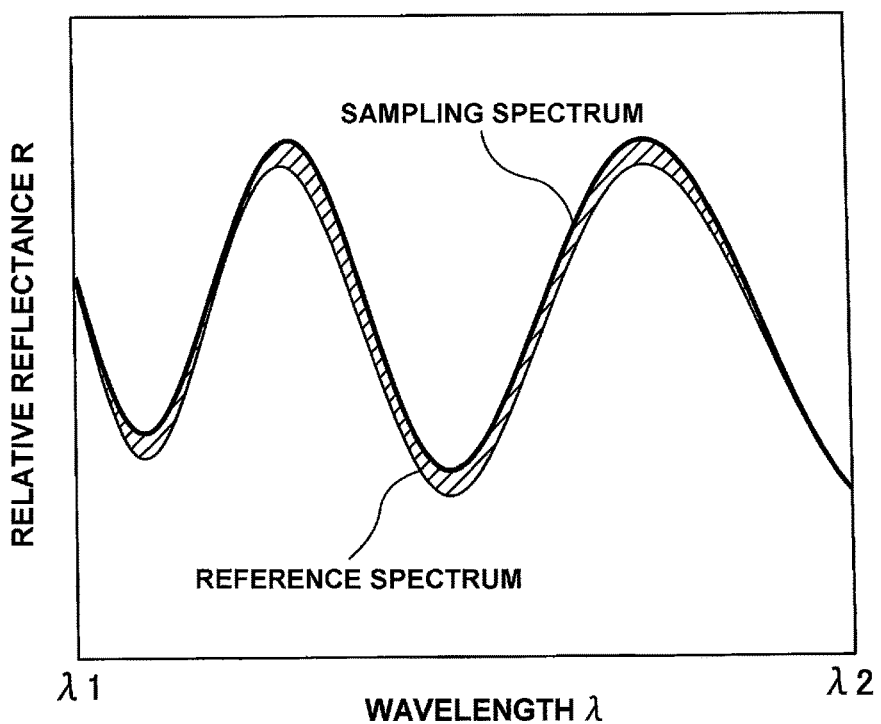
FIG. 9 is a diagram showing a sampling spectrum and a reference spectrum.

FIG. 9 is a diagram showing the sampling spectrum and the reference spectrum. The above equation (2) is an equation for calculating the deviation of the reference spectrum from the sampling spectrum. This deviation corresponds to a region (a hatched region shown in FIG. 9) enclosed by these two spectra. Using the equation (2), the processor 32 determines a reference spectrum with the smallest deviation from the sampling spectrum, i.e., a reference spectrum which is closest in shape to the sampling spectrum. The processor 32 then selects, from the plural spectrum groups, a spectrum group to which the determined reference spectrum belongs.

Figure 10:
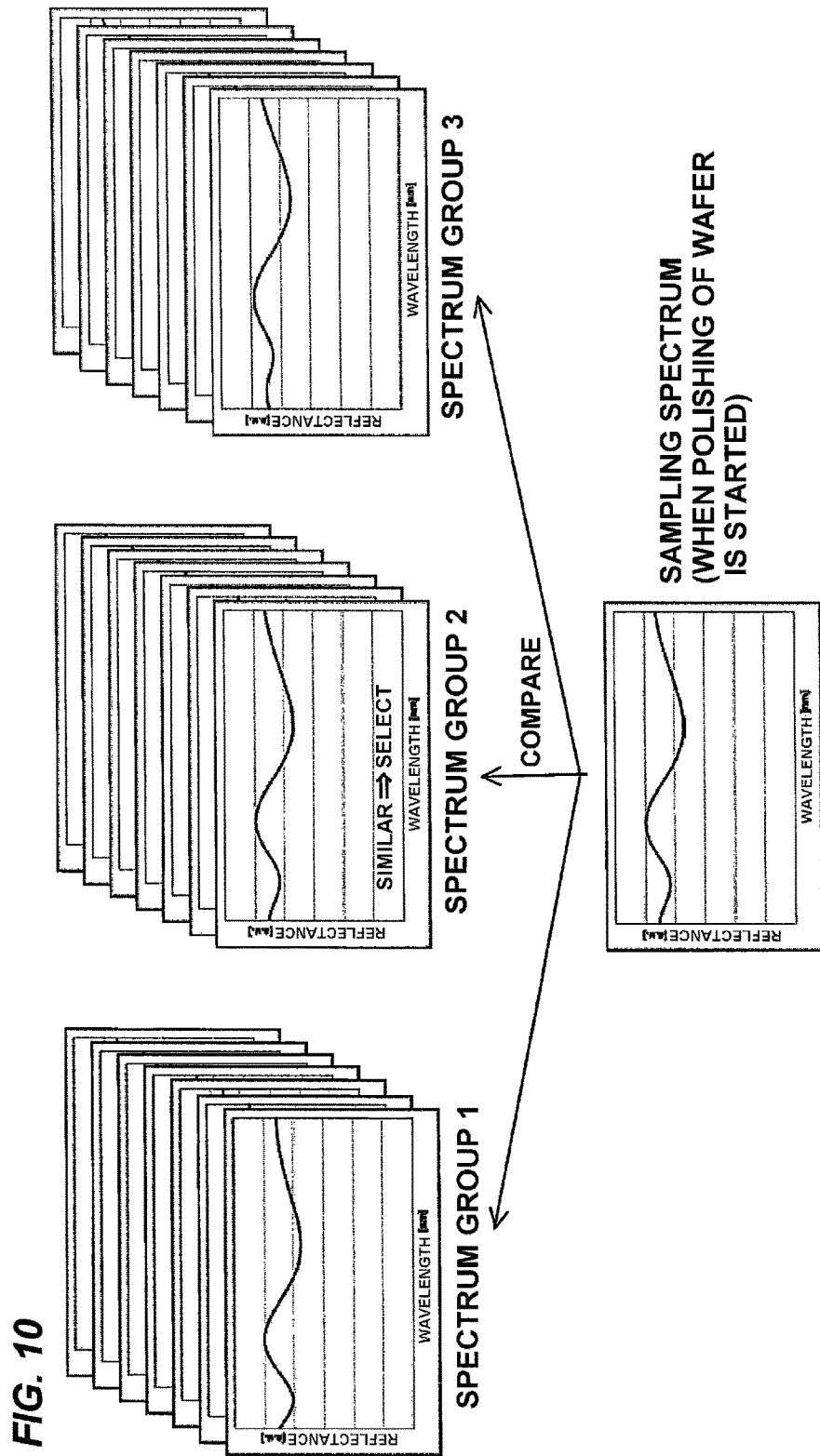
FIG. 10 is a schematic diagram illustrative of a process of selecting one spectrum group from a plurality of spectrum groups.

FIG. 10 is a schematic diagram illustrative of a process of selecting one spectrum group from the plurality of spectrum groups. The storage device 58 (see FIGS. 1 and 3) stores the plurality of spectrum groups as shown in FIG. 10 in advance. Each of the spectrum groups contains a plurality of reference spectra corresponding respectively to different film thicknesses of a film to be polished. The processor 32 produces a sampling spectrum from the light reflected from the target wafer and determines (or selects) a spectrum group containing a reference spectrum which is closest in shape to the sampling spectrum produced.

The plurality of spectrum groups are obtained under a condition that the structure of the underlying layer is different. Therefore, the reference spectra are different between the spectrum groups due to the difference in the structure of the underlying layer. The influence of the difference in the structure of the underlying layer can be eliminated by selecting a spectrum group containing the reference spectrum which is closest in shape to the sampling spectrum. As a result, the processor 32 can obtain a more accurate film thickness.

The areas (hereinafter referred to as "reference areas") defined on a wafer surface where the spectrum groups are obtained may be a plurality of reference areas defined by a plurality of radius ranges. One reason for this is that, in many cases, the thickness of the underlying layer varies generally in approximately an axisymmetric manner within the wafer surface because of the characteristics of a film deposition process prior to the polishing process and the polishing process itself Another reason is that if the rotational speeds of the polishing table 3 and the polishing head 5 are set so as to cause the film thickness sensor 31 to scan the wafer surface uniformly in a circumferential direction of the wafer surface and return to its original position within a predetermined short time, the influence of variation in the structure of the underlying layer in the circumferential direction of the wafer can be reduced by averaging spectral data obtained in the predetermined short time. For example, where the rotational speed of the polishing table 3 is 90 rpm and the rotational speed of the polishing head 5 is 99 rpm, the polishing head 5 makes eleven revolutions until the film thickness sensor 31 returns to its original position on the wafer surface, while the polishing table 3 makes ten revolutions. Therefore, the influence of variation in the structure of the underlying layer in the wafer surface can greatly be reduced by averaging spectral data obtained during the ten revolutions of the polishing table 10.

The structure of the underlying layer of the reference wafer, particularly a thickness of the underlying layer, can be measured before or after the reference wafer is polished with use of a standalone film-thickness measuring unit or an inline film-thickness measuring unit which is assembled in the polishing apparatus. In these types of film-thickness measuring units, a thickness or a structure of the underlying layer is measured while the reference wafer is in a stationary state. It is preferable that, based on a distribution of measured thicknesses of the underlying layer of one or more reference wafers, reference areas be selected in each of the reference wafers so that the thicknesses of the underlying layer are distributed as uniformly as possible over an entirety of a range from the smallest thickness to the largest thickness. A plurality of spectrum groups are obtained in each of the selected reference areas.

If such information of the structure of the underlying layer cannot be obtained in advance, reference areas may preferably be determined so as to be distributed as uniformly as possible over the surface of each reference wafer. Furthermore, it is more preferable to narrow down the number of spectrum groups in advance by eliminating a spectrum group containing reference spectra which are close in shape to those of another spectrum group. The similarity in shape between the reference spectra can be determined using the above-described equation (2). The reference spectrum may have maximum local points and minimum local points which can vary depending on the structure of the underlying layer. In such a case, attention may be directed to wavelengths of the maximum local points or the minimum local points, and a reference area of the reference wafer may be selected such that all of the wavelengths of the maximum local points or the minimum local points are distributed as uniformly as possible within a range from the smallest wavelength to the largest wavelength.

The process of selecting the spectrum group may be carried out while the target wafer is being polished or before the target wafer is polished. If the spectrum group is selected while the target wafer is being polished, it is preferable to use a sampling spectrum which has been produced within a preset polishing time. For example, a sampling spectrum to be used may be produced until a predetermined time elapses from the start of the polishing. This sampling spectrum is compared with a plurality of reference spectra in the plurality of spectrum groups, and a spectrum group containing a reference spectrum, which is closest in shape to the sampling spectrum, is selected.

If a spectrum group is selected before the target wafer is polished, it is preferable to use a sampling spectrum produced while the target wafer is being water-polished. This water-polishing process is a process in which the target wafer is placed in sliding contact with the polishing pad while pure water, rather than the slurry, is being supplied onto the polishing pad. The target wafer is water-polished in the presence of the pure water existing between the target wafer and the polishing pad. Unlike the slurry, the pure water does not contain abrasive grains and does not have an etching action on a film of the wafer. Accordingly, polishing of the target wafer does not substantially progress when the target water is being water-polished.

Alternatively, if spectrum groups have been determined using the standalone film-thickness measuring unit or the inline film-thickness measuring unit, it is possible to measure the structure and/or the thickness of the underlying layer of the target wafer with use of the inline film-thickness measuring unit assembled in the polishing apparatus and to select a corresponding spectrum group. In this case, each time one target wafer is polished, it is preferable to measure the underlying layer of that target wafer. If structures of underlying layers in one lot are regarded as being uniform, one target wafer in each lot may be measured. If the structure of the underlying layer varies between odd-numbered wafers and even-numbered wafers due to, for example, a variation in a film deposition chamber used in a film deposition process, measuring of the thickness may be performed on two target wafers, one of which is selected from the odd-numbered group and other is selected from the even-numbered group.

Once a spectrum group has been selected, the processor 32 produces the measurement spectrum during polishing of the target wafer, and selects a reference spectrum, which is closest in shape to the produced measurement spectrum, from the spectrum group that has been selected as discussed above. More specifically, the processor 32 uses the equation (2) to determine a reference spectrum that is closest in shape to the measurement spectrum, i.e., a reference spectrum with the smallest deviation from the measurement spectrum, and obtains a film thickness that has been associated with the determined reference spectrum. The processor 32 monitors the polishing process of the target wafer based on the determined film thickness, and determines a polishing endpoint at which the film thickness is lower than a predetermined target value. The processor 32 sends a polishing endpoint detection signal to the polishing controller 12, which in turn terminates polishing of the target wafer in response to the polishing endpoint detection signal. At each point in time during the polishing process of the target wafer, the processor 32 determines manipulated variables (or control variables) for obtaining a predetermined distribution of remaining film thicknesses, on the basis of the film thicknesses determined in the respective areas on the surface of the target wafer. The manipulated variables (or control variables) may be pressure command values for the pressure chambers D1 through D5. The processor 32 sends these pressure command values to the polishing controller 12, which updates the pressures based on the command values that have been sent to the polishing controller 12.

As the polishing of the target wafer progresses, the measurement spectrum may vary greatly due to some factors, such as a temperature of the target wafer, a change in the shape of the surface of the target wafer, etc. For example, in an initial stage of the polishing process of the target wafer, asperities (or steps) may exist on the surface of the target wafer. When such asperities are removed by the polishing, the measurement spectrum may vary greatly. In a stage where the asperities remain unremoved, the measurement spectrum is relatively unstable depending on the state of the asperities, and may vary between wafers or between areas within the surface of the wafer. In contrast, in a stage where the asperities have been removed by the polishing, a stable measurement spectrum is likely to be obtained.

Thus, the processor 32 may produce a sampling spectrum again during the polishing process of the target wafer, and may select again a spectrum group containing a reference spectrum which is closest in shape to this sampling spectrum produced. Since the sampling spectrum produced during the polishing process of the target wafer is substantially the same as the measurement spectrum, the measurement spectrum may be used as the sampling spectrum. After the spectrum group has been selected again, the processor 32 selects a reference spectrum, which is closest in shape to the measurement spectrum, from the spectrum group that has been selected again. By thus selecting the spectrum group again, a more accurate film thickness can be obtained especially in a latter half of the polishing process which has an important significance for a finishing performance.

A plurality of spectrum groups obtained in areas near the area where the film thickness of the target wafer is to be monitored may be selected in advance. For example, for more precisely controlling a film thickness of a peripheral portion of the target wafer, a plurality of spectrum groups obtained in a peripheral portion of a reference wafer may preferably be selected in advance from all the spectrum groups, and a spectrum group containing a reference spectrum, which is closest in shape to the sampling spectrum, may preferably be selected from these spectrum groups that have been selected in advance. As described above, the structure of the underlying layer may often vary from area to area within the surface of the wafer. Moreover, depending on the structures of the polishing apparatus and the film thickness sensor 31, the film thickness sensor 31 may often scan the same position on the wafer surface in the same direction in the same area of the wafer surface. Simultaneous using of the above-described setting of the rotational speeds of the polishing table 3 and the polishing head 5 and the above-described averaging calculation of spectral data can reduce the influence of interconnect patterns in the measurement areas. Consequently, an accurate film thickness can be measured efficiently by selecting, in advance, several spectrum groups obtained in areas near the area to be monitored.

As described above, the reference spectra are obtained in advance using the reference wafer(s) or by the simulation. The reference spectra thus obtained may include reference spectra which are similar in shape between spectrum groups. In order to shorten a time required to compare with reference spectra, it is preferable to exclude in advance any one of spectrum groups including reference spectra which are close in shape to each other to thereby provide a unique set of spectrum groups. According to this operation, the processor 32 is able to compare the sampling spectrum with the reference spectra in a shorter time.

Figure 11:
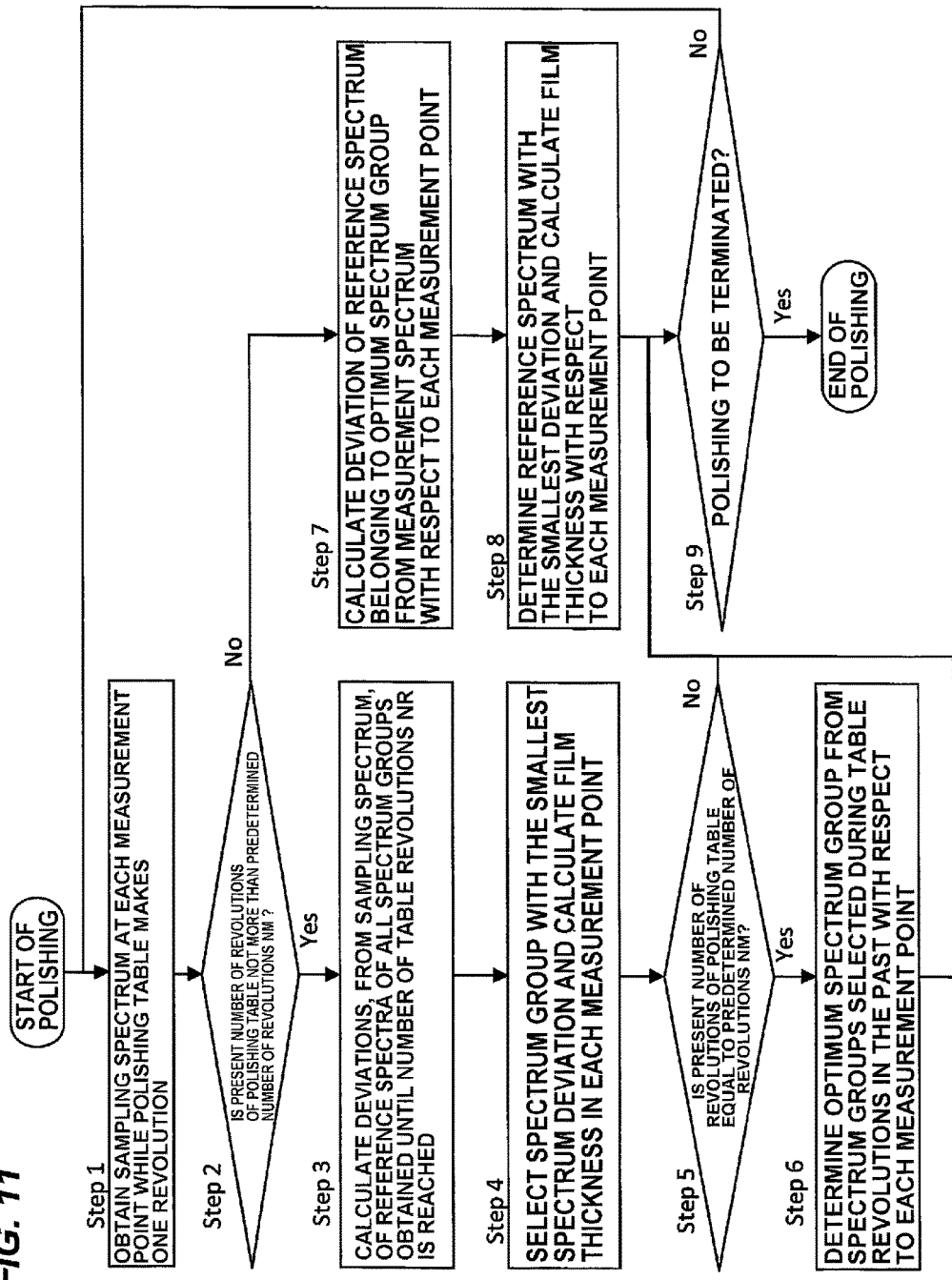
FIG. 11 is a flowchart showing an example of a sequence of determining a film thickness at each revolution of the polishing table while one wafer is being polished.

FIG. 11 shows an example of a flow of determining a film thickness in each revolution of the polishing table 3 while one wafer is being polished, with an attention directed to the selection of spectrum. Determining a film thickness of a target wafer based on a comparison between a measurement spectrum (and a sampling spectrum) and reference spectra may hereinafter be referred to as estimating a film thickness. This is because, according to the present embodiment, a film thickness of a target wafer is determined by way of the calculation based on information about an actually measured value of an initial film thickness of a reference wafer, an actually measured value of a final film thickness of the reference wafer, and a polishing time of the reference wafer.

In step 1, at each of measurement points on a target wafer, a sampling spectrum of the reflected light is obtained while the polishing table 3 is making one revolution. In step 2, the processor 32 determines whether the polishing table 3 has made a predetermined number of revolutions NM after polishing of the target wafer is started. A subsequent flow of film thickness estimation is different depending on a magnitude relationship between the present number of revolutions of the polishing table 3 and the predetermined number of revolutions NM. Generally, there may exist a variation to some extent in initial film thickness (i.e., film thickness prior to polishing) between wafers even if specifications (product, layer, etc.) of the wafers are the same. The predetermined number of revolutions NM is set such that the film thickness of the target wafer can sufficiently be lower than the initial film thickness of the reference wafer as a result of polishing of the target wafer, even if the target wafer has the initial film thickness which corresponds to the largest value in the range of the variation. This is because the film thickness estimation based on the comparison with the reference spectra can determine a film thickness of the target wafer only within a range of film thicknesses corresponding to those of the reference spectra.

If the predetermined number of revolutions NM is too large, it is necessary to carry out step 3, which will be described later, for a long time with respect to all of the spectrum groups (all of reference area candidates), thus possibly causing an increase in calculation load on the processor 32 and hence lowering a responsiveness of the processor 32. In such a case, the number of revolutions NM is set to be a suitable number in view of the fact that a thickness and an optical constant of the underlying layer in each area of the wafer surface do not vary during the polishing process. If a sampling spectrum cannot be determined during a certain number of revolutions at an initial stage of the polishing process for a certain reason, e.g., for a reason of a moving average of spectra, that number of revolutions may be added to NM.

If the present number of revolutions of the polishing table 3 is determined to be equal to or smaller than the predetermined number of revolutions NM in the step 2, then the processor 32 calculates deviations of the reference spectra, which belong to all the spectrum groups (all reference area candidates), from the sampling spectrum (step 3). The reference spectra which are subject to the calculation of the deviations in this step 3 are reference spectra of all the spectrum groups that have been obtained during a period from when the polishing of the reference wafer is started until a predetermined number of table revolutions NR is reached. The predetermined number of table revolutions NR is set such that some of film thickness candidates corresponding to the reference spectra can sufficiently be lower than the initial film thickness of the target wafer even if the target wafer has an initial film thickness which is equal to the smallest value of the range of the variation in the initial film thickness of the target wafer. Furthermore, it is preferable that the number of table revolutions NR be set to be a suitable numerical value in view of the calculation load and a change in the film thickness of the target wafer during the number of revolutions NM. If a reference spectrum cannot be obtained during a certain number of revolutions at an initial stage of polishing for a reason of the moving average of spectra or other reason, reference spectra which have been initially obtained during the number of revolutions NR are subject to the calculation of the deviations.

In step 4, the processor 32 selects the smallest one of the deviations determined in the step 3 (i.e., the smallest deviation) with respect to each of the measurement points on the target wafer, selects a spectrum group to which a reference spectrum, corresponding to the selected smallest deviation, belongs, and estimates the film thickness of the target wafer from the film thicknesses measured before and after the processing process and the polishing time of the selected spectrum group, and from the polishing time (i.e., the time that has elapsed from the polishing start) of the reference spectrum with the smallest deviation. The processor 32 stores the selected spectrum group (reference area candidate). The processor 32 may also store the smallest deviation.

In steps 5, 6, if the present number of revolutions of the polishing table 3 is equal to the predetermined number of revolutions NM, one optimum spectrum group (or an optimum reference area) is determined at each of the measurement points on the target wafer on the basis of the selection results in the step 4 that have been obtained during table revolutions in the past. For example, an optimum spectrum group may be determined as follows:

1) a spectrum group (or a reference area candidate) with the highest frequency of the smallest deviation determined in the step 4 is determined to be an optimum spectrum group (or an optimum reference area); or 2) a spectrum group (or a reference area candidate) with the smallest one of the smallest deviations determined in the step 4 is determined to be an optimum spectrum group (or an optimum reference area).

If the present number of revolutions of the polishing table 3 is larger than the predetermined number of revolutions NM, the measurement spectrum obtained in each of the measurement points on the target wafer is compared with the reference spectra which belong to the optimum spectrum group determined in the step 6, and spectrum deviations are calculated (step 7). A range of the revolutions in which the reference spectra are to be compared is not the revolutions NR in the initial stage of the polishing process, but should be determined in view of the change in the film thickness which occurs as polishing of the wafer progresses, and may be a total revolution range (i.e., a total film-thickness range).

In step 8, the processor 32 determines a polishing time (i.e., a time that has elapsed from the polishing start) allocated to a reference spectrum with the smallest spectrum deviation calculated in step 7 at each of the measurement points on the target wafer, and calculates a film thickness. In step 9, the processor 32 determines whether the polishing process is to be terminated on the basis of a designated polishing time or a polishing endpoint detection or other criterion. If the polishing process is not to be terminated, then the step 1 is carried out again. If sufficient calculation resources are available, the numbers of revolutions NM, NR may be set to be sufficiently large values in the steps 2, 3. In this case, the steps 1 through 5 and the step 9 are repeated throughout the polishing process.

Figure 12:
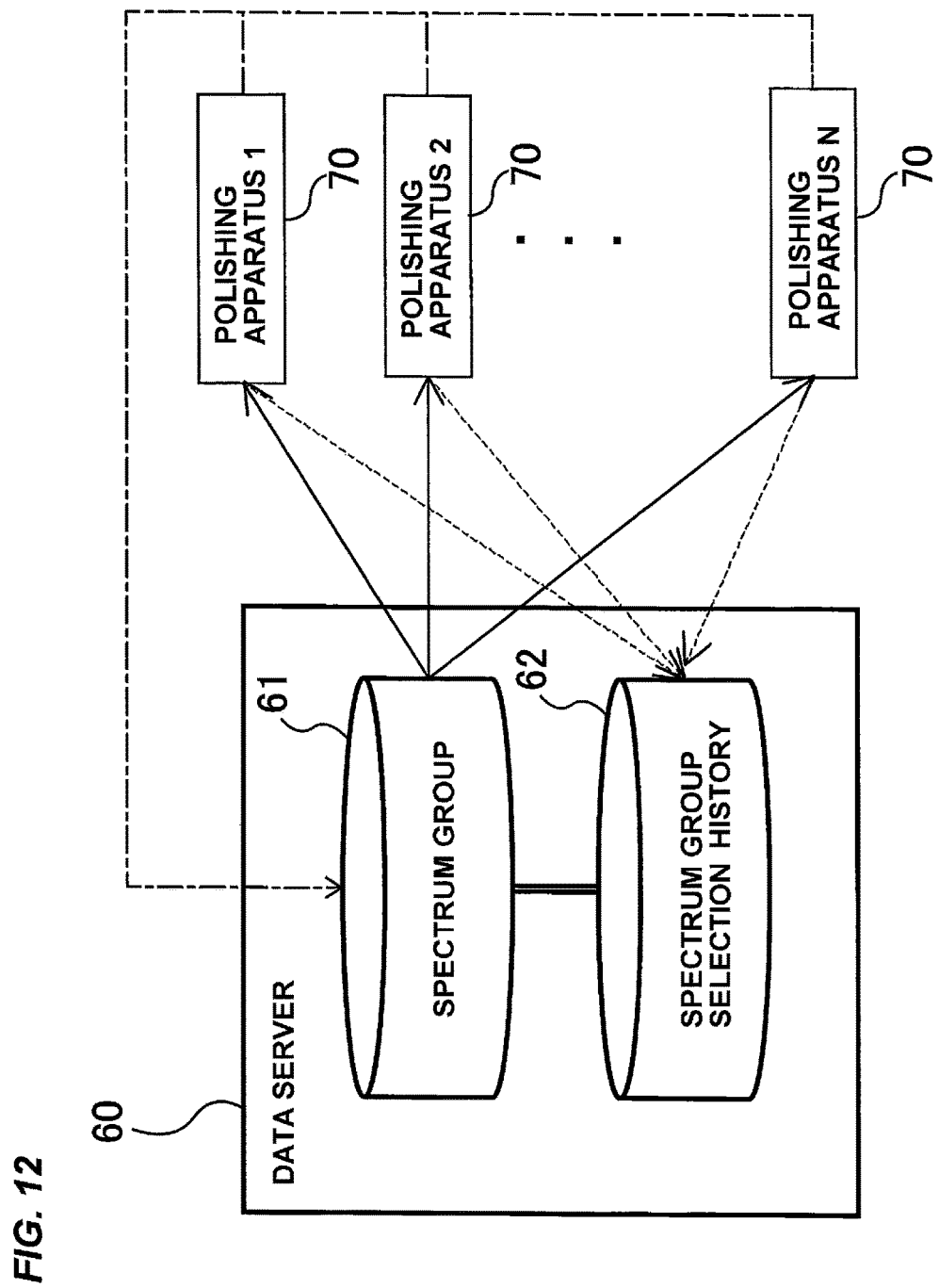
FIG. 12 is a diagram showing a configuration of a database system for managing the spectrum groups.

FIG. 12 is a diagram showing a configuration of a database system for managing the above-described spectrum groups. A data server 60 has a spectrum group database 61 constructed therein. The spectrum group database 61 stores therein identification information of spectrum groups, reference spectra belonging to each one of the spectrum groups, and associated film thickness information. The data server 60 is coupled to one or more polishing apparatuses 70 via a network, so that the one or more polishing apparatuses 70 can share the spectrum group database 61. As indicated by dot-and-dash lines in FIG. 12, reference spectra and information of film thickness before and after the polishing process, which have been obtained in each polishing apparatus 70, are sent to the data server 60, where they are registered in the spectrum group database 61. The polishing apparatuses 70, which polish wafers of the same specification (i.e., the same product, the same layers), may preferably share the single spectrum group database 61.

When each polishing apparatus 70 is about to polish a target wafer and determine a film thickness, predetermined spectrum groups are automatically downloaded from the spectrum group database 61, as indicated by solid lines shown in FIG. 12. The spectrum groups to be downloaded may be designated as a part of a polishing recipe. Thereafter, each polishing apparatus 70 selects a spectrum group and calculates a film thickness at each of the measurement points, as described above. In addition, the polishing apparatus 70 saves information about the actually selected spectrum group into a storage area thereof.

When the polishing process is terminated in the polishing apparatus 70, as indicated by dotted lines in FIG. 12, the information about the selected spectrum group is automatically sent to the data server 60, where the information is registered as history information in a spectrum group selection history database 62. The spectrum group selection history database 62 and the spectrum group database 61 are organically linked to each other through spectrum group identification numbers serving as a common key. Alternatively, the spectrum group selection history database 62 may be constructed integrally with the spectrum group database 61.

The data server 60 deletes a spectrum group, which has not actually been selected or have been selected very few times within a predetermined period of time, from the database 61 on the basis of the history information about the selection of spectrum groups. The data server 60 also ranks spectrum groups and adjusts the ease with which to select them, on the basis of frequency of the selection. During polishing of a target wafer, if an optimum spectrum group with a sufficiently small deviation determined by the equation (2) was not be able to be selected at a certain measurement point, then it is possible to register, in the database 61, data of that measurement point of the wafer as a new spectrum group in combination with the information of film thickness measured before and after the polishing process by the inline film-thickness measuring unit or other device. In this manner, an efficient database system having a learning function and containing less unnecessary information can be realized.

Figure 13:
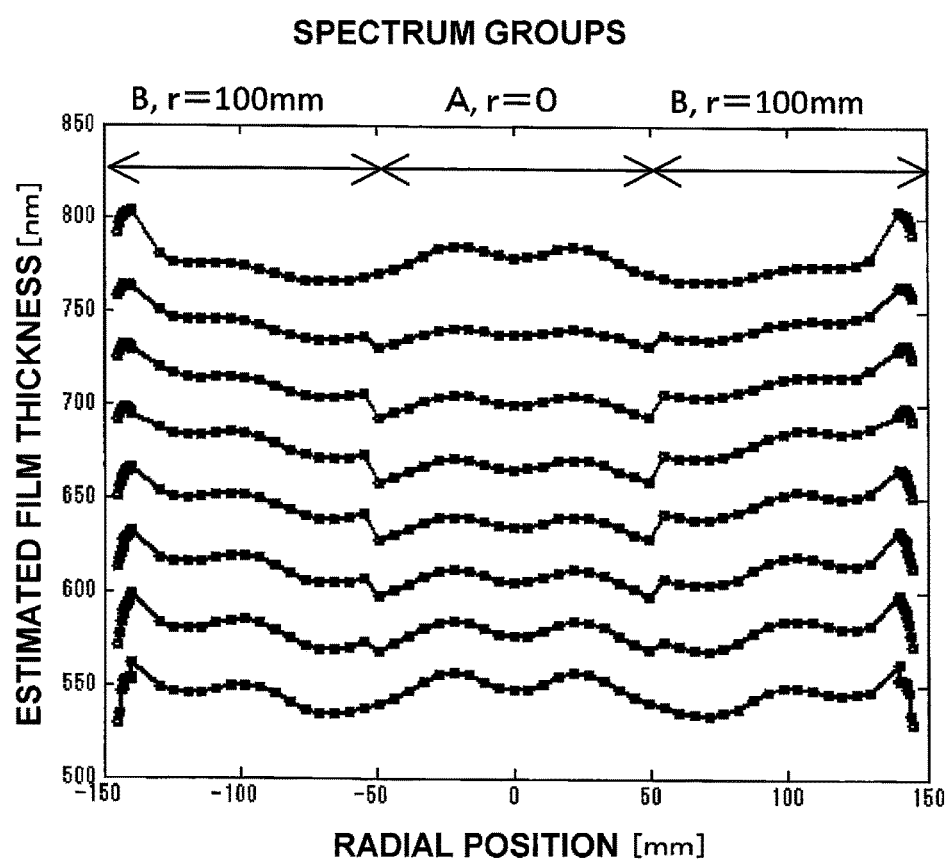
FIG. 13 is a diagram showing a film-thickness profile estimated using a plurality of spectrum groups while one target wafer is being polished.

FIG. 13 is a diagram showing a film-thickness profile estimated using a plurality of spectrum groups while one target wafer is being polished. The film-thickness profile shown in FIG. 13 was plotted about every 10 seconds. In a method of selecting a suitable one of a plurality of spectrum groups obtained on the basis of an actual polishing process and determining a film thickness, spectrum groups (i.e., reference wafers and reference areas) may change at a certain measurement point on the surface of the target wafer. In FIG. 13, the spectrum group for use in estimating a film thickness is switched at a radial position of about 50 mm between a spectrum group A (obtained in a central area of a reference wafer) and a spectrum group B (obtained in an area at a radial position of about 100 mm on a reference wafer). As a result, steps are generated in the film-thickness profile.

Such steps are due to an assumption that a polishing rate of a reference wafer used to construct each spectrum group is constant during polishing and the film thickness decreases linearly. In an actual polishing process, a polishing rate is not strictly constant in each area in the wafer surface, and the manner of change in the polishing rate is different between areas. In the example shown in FIG. 13, since the film thicknesses of the reference wafer and the target wafer before and after the polishing process are substantially equal to each other, almost no step appears in initial and final stages of the polishing process. In a middle stage of the polishing process, however, steps appear in the film-thickness profile at the radial position of about 50 mm due to the switching of the spectrum groups. Such steps in the film-thickness profile may lower the controlling performance, particularly when a distribution of remaining film thickness (i.e., a profile) is controlled.

Figure 14:
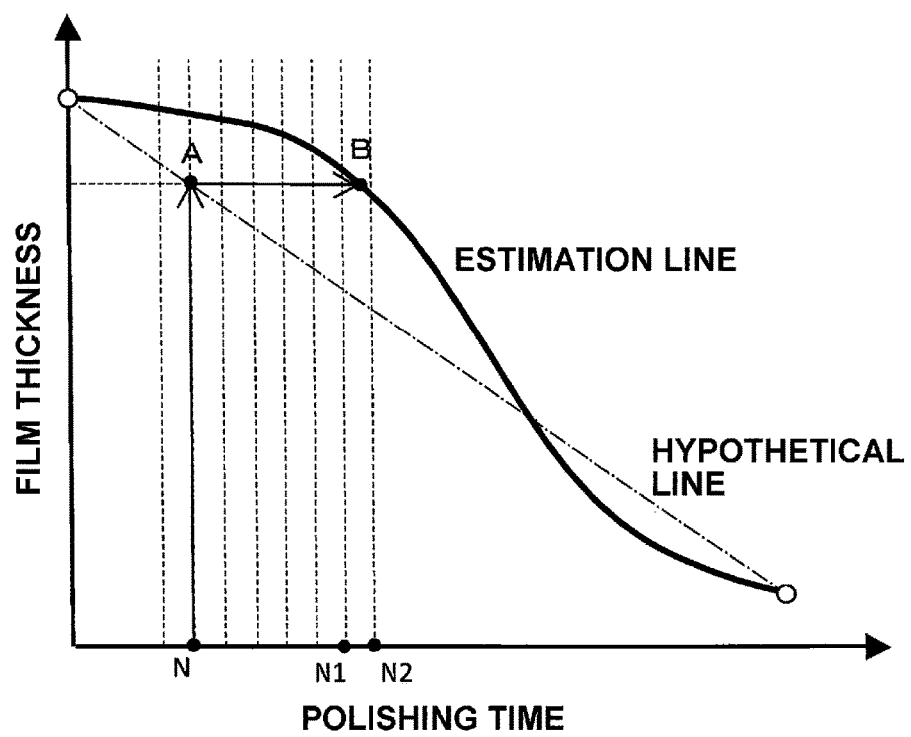
FIG. 14 is a diagram illustrative of a process of correcting a corresponding reference spectrum such that a polishing rate can be regarded as constant while a reference wafer is being polished.

Thus, the processor 32 corrects a corresponding reference spectrum such that a polishing rate, while a reference wafer is being polished, can be regarded as constant in each of reference areas defined in the surface of the reference wafer. FIG. 14 is a diagram illustrative of a process of correcting a reference spectrum. With respect to each spectrum group, dot-and-dash line in FIG. 14 represents a hypothetical line indicating a change in the film thickness with time on the assumption that the polishing rate is constant during polishing of the reference wafer. As shown by the hypothetical line, the film thickness on the assumption that the polishing rate is constant varies linearly with the polishing time from an initial film thickness (i.e., a film thickness measured before the polishing process) denoted by a symbol ○ to a final film thickness (i.e., a film thickness measured after the polishing process). The initial film thickness and the final film thickness are measured by the standalone film-thickness measuring unit or the inline film-thickness measuring unit.

In contrast, a curved line depicted by a solid line represents an estimation line indicating a change in the film thickness of the reference wafer with time, and reflects a change in the polishing rate. This estimation line passes through the initial film thickness and the final film thickness denoted by the symbol ○.

A process of determining the estimation line will be described later.

A reference spectrum when the polishing table 3 is making an N-th revolution is corrected as follows. First, a film thickness at a point A on the hypothetical line at the N-th revolution is determined. Then, a point B on the estimation line at which the film thickness is equal to the film thickness at the point A is determined. Generally, the point B lies between the N1-th revolution and an N2 (=N1+1)-th revolution which are adjacent to each other. Accordingly, a spectrum corresponding to the point B is determined by interpolation based on reference spectra corresponding to the N1-th revolution and the N2-th revolution. The spectrum determined is used as a corrected reference spectrum at the N-th revolution. By repeating the same operation with respect to each of the revolutions of the polishing table 3, a series of corrected reference spectra can be determined. The determined corrected reference spectra can be regarded as reference spectra in the case where the polishing rate of the reference area of the corresponding reference wafer is constant throughout the polishing time.

Figure 15:
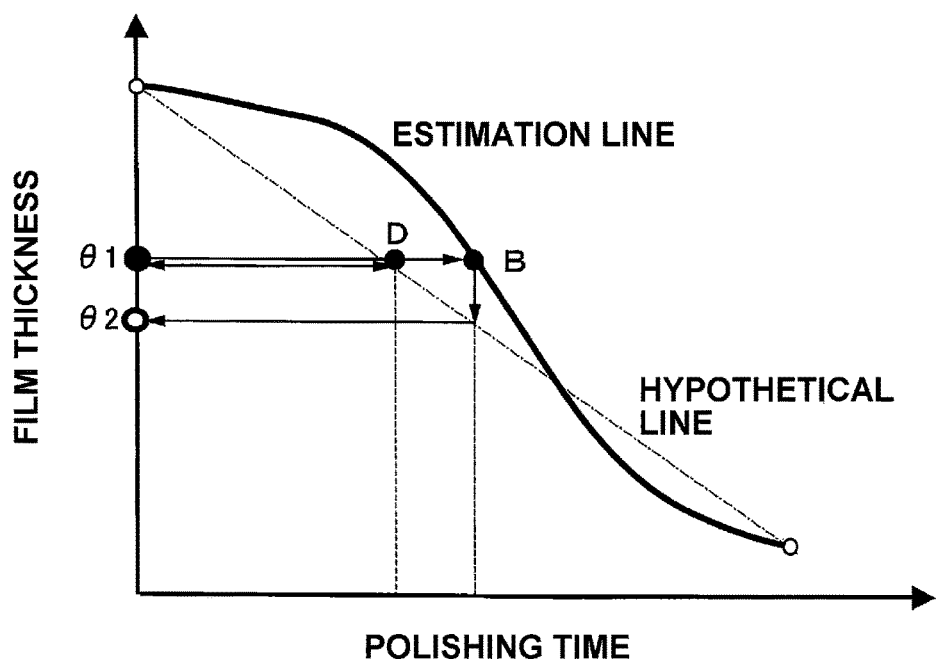
FIG. 15 is a diagram showing an effect of a corrected reference spectrum.

The effect of the corrected reference spectrum thus determined will be described below with reference to FIG. 15. θ1 represents a film thickness of the target wafer at a certain point in time. If the reference spectra are not corrected, a spectrum corresponding to the film thickness θ1 corresponds to (i.e., is equal or close to) a reference spectrum at the point B on the estimation line. Generally, since it is assumed that the film thickness varies linearly, i.e., the polishing rate is constant, during polishing of the reference wafer, the calculated film thickness of the target wafer is θ2, which is different from the actual film thickness θ1. In contrast, in the case where the reference spectrum is corrected as described above, a spectrum corresponding to the film thickness θ1 corresponds to a corrected reference spectrum at a point D on the hypothetical line. Therefore, the calculated film thickness is θ1, and it can be seen that the film thickness of the target wafer is determined correctly.

Figure 16:
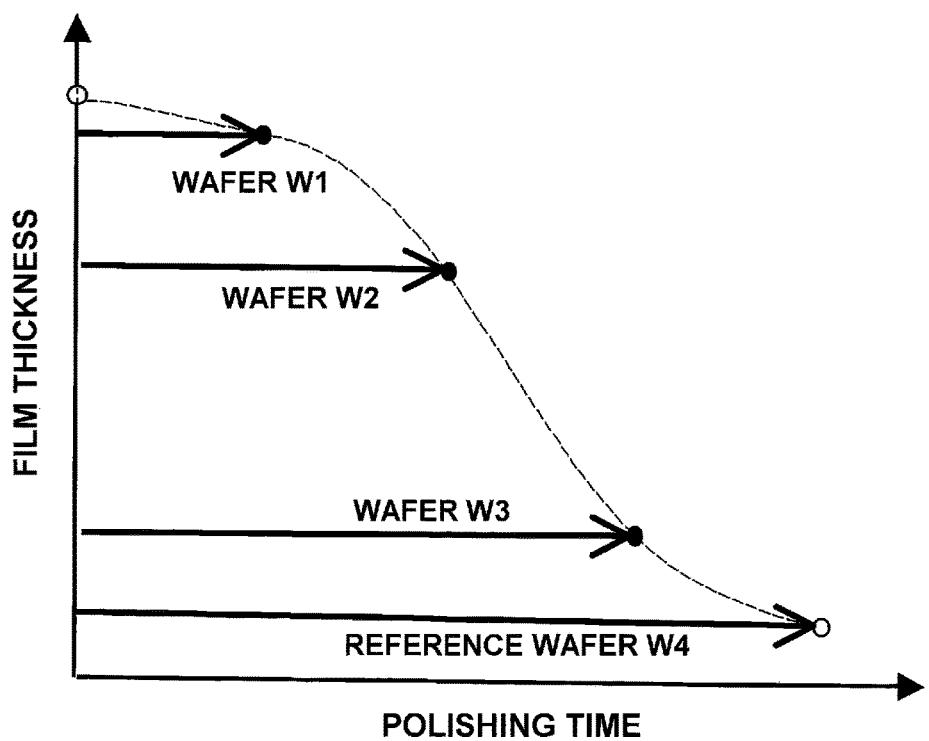
FIG. 16 is a graph showing a method of determining an estimation line shown in FIG. 14.

FIG. 16 is a graph showing a method of determining the above-described estimation line. A horizontal axis of the graph represents polishing time, and a vertical axis represents film thickness. A plurality of wafers (wafers W1 to W3) having the same specification and a reference wafer W4 are polished for different set times. Film thicknesses of these wafers are measured before and after the polishing process by the standalone or inline film-thickness measuring unit. If initial film thicknesses (i.e., film thicknesses measured before the polishing process) of the wafers W1 to W3 are equal to an initial film thickness of the reference wafer W4, the initial film thickness is indicated by the symbol ○ on the vertical axis. Final film thicknesses (i.e., film thicknesses measured after the polishing process, denoted by symbol ● in FIG. 16) of the wafers W1 through W3 and the final film thickness (denoted by the symbol ○) of the reference wafer W4 are also plotted onto the graph. The above estimation line is obtained by interpolating film thicknesses between the initial film thickness of the reference wafer W4, the final film thicknesses of the wafers W1 to W3, and the final film thickness of the reference wafer W4. If the initial film thickness of the wafers W1 to W3 is different from the initial film thickness of the reference wafer W4, a deviation from the initial film thickness of the reference wafer W4 may be added to the final film thicknesses of the wafers W1 to W3, so that the same operation can be achieved.

Figure 17:
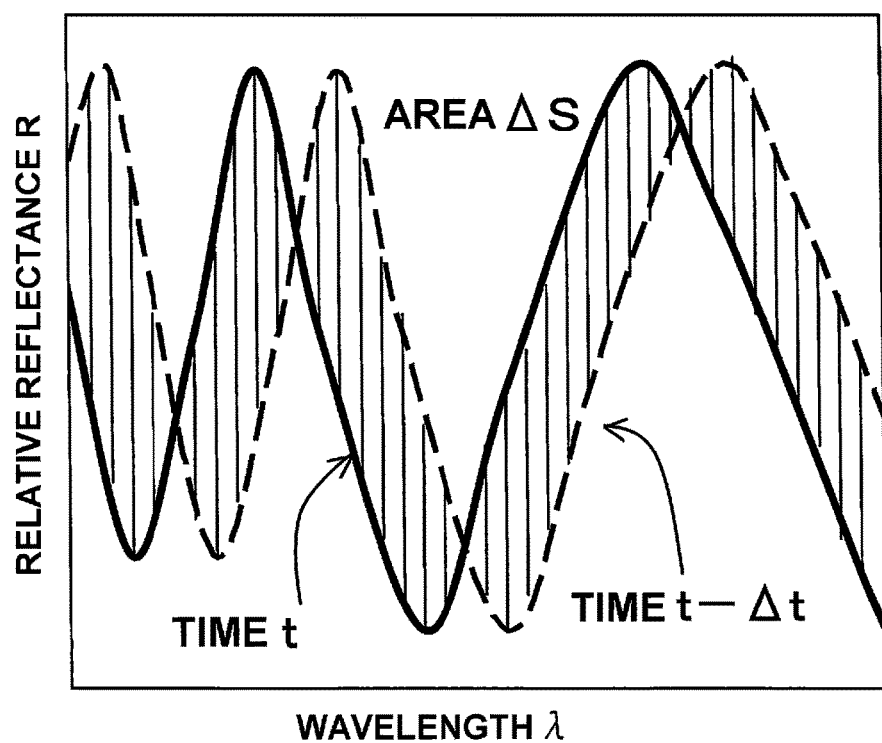
FIG. 17 is a graph illustrative of another method of obtaining the estimation line.

FIG. 17 is a graph illustrative of another method of obtaining the estimation line. The spectrum of the reflected light from each of areas of the reference wafer varies during polishing of the reference wafer as the film thickness decreases. A value obtained by integrating a change ΔS in the relative reflectance per short time Δt is approximately in agreement with an amount of polishing, i.e., a decrease in the film thickness.

[EQUATION 3]

$$\Delta S(t) = |Rp(\lambda, t) - Rp(\lambda, t - \Delta t)| \quad (3)$$

$$S(t) = \left[\sum_{t=0}^{t} \Delta S(t)\right] / \sum_{t=0}^{T} \Delta S(t) \quad (4)$$

$$\theta(t) = \theta\text{pre} + S(t)(\theta\text{post} - \theta\text{pre}) \quad (5)$$

where Rp(λ,t) represents a relative reflectance at a wavelength λ and a time t, which may be preprocessed in the same manner as with the equation (2), S(t) represents a relative change in the spectrum at the time t where the change in the spectrum with respect to a total polishing time T is 1, and θpost and θpre represent film thicknesses which are measured by the standalone or inline film-thickness measuring unit before and after the polishing process, i.e., an initial film thickness and a final film thickness. θ(t) corresponds to the estimation line described above.

Figure 18:
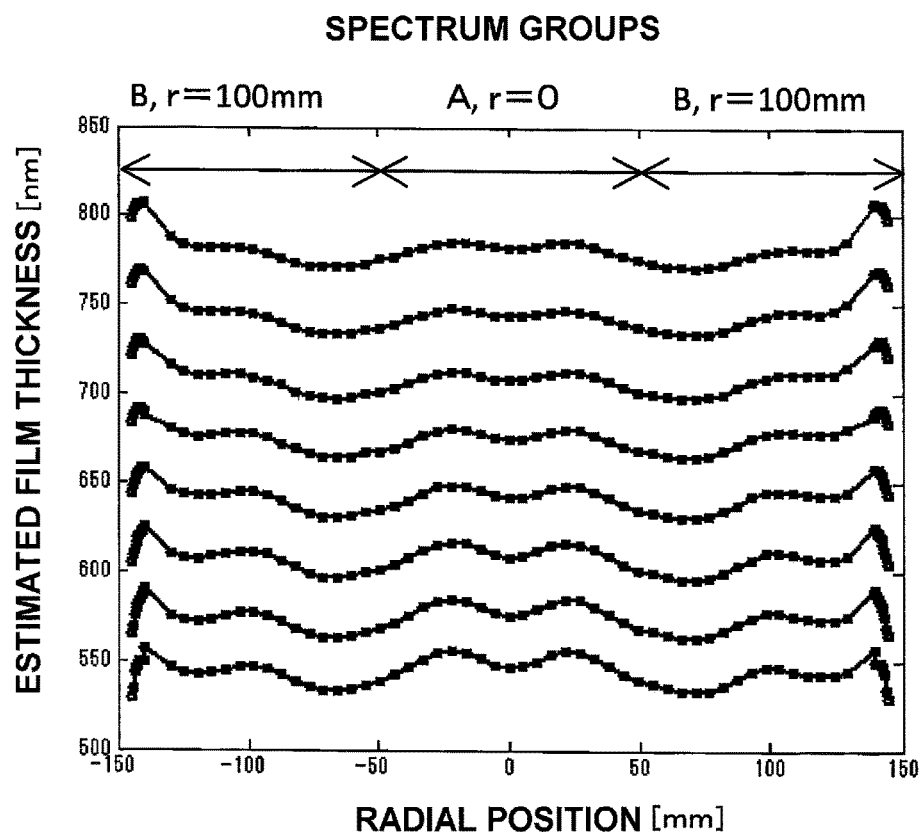
FIG. 18 is a diagram showing a film-thickness profile obtained by correcting a reference spectrum according to a method which uses an amount of change in spectrum, with respect to the target wafer and the spectrum groups shown in FIG. 13.
Figure 19:
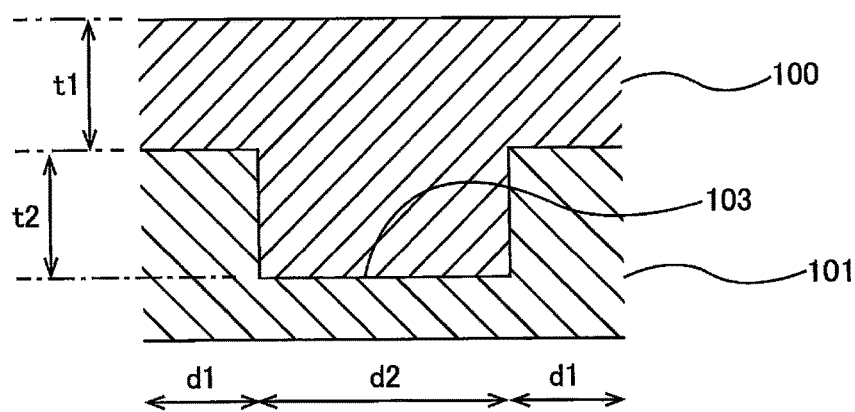
FIG. 19 is a cross-sectional view showing a surface structure of a wafer.

FIG. 18 is a diagram showing a result of a process of estimating a film-thickness profile with respect to the target wafer and the spectrum groups shown in FIG. 13 by correcting reference spectra according to the method using the above-described change in the spectrum. As can be seen from FIG. 18, the steps at the boundary of the spectrum groups shown in FIG. 13 are eliminated, and a reliable film-thickness profile is obtained.

If one spectrum group is applied, the steps in the film-thickness profile as described above are not produced, and a film-thickness profile obtained is relatively correct. If the film thickness of the polished reference wafer is substantially the same as the film thickness of the polished target wafer, an absolute value of the film thickness for determining a polishing endpoint is considered to be correct as well. Even in such cases, however, the accuracy of the film-thickness estimation can be increased by correcting the reference spectra such that the polishing rate can be regarded as constant.

The above-described steps that appear in the estimated film-thickness profile can be improved by using a change in wavelength at an extremum point (a peak or a valley) of the measurement spectrum obtained during the polishing process. Generally, in a pattern wafer, a wavelength at the extremum point does not vary linearly with a decrease in a film thickness of a film being polished, and it is therefore difficult to express the change in the polishing rate with use of a quantitative value. However, even when the manner of change in the polishing rate is different between the reference areas, the influence on the film-thickness estimation can be reduced by selecting one spectrum group of a certain reference wafer as a criterion and carrying out the operations described with reference to FIG. 14 using a curved line, drawn by the wavelength at the extremum point during the polishing process, as a hypothetical line.

It has been described above that the spectrum of the reflected light varies not only with the film thickness of the film being polished, but also with the structure of the underlying layer. However, there are other factors that cause the spectrum of the reflected light to vary even if the film thickness is the same. For example, if the film contains metal interconnects, the spectrum changes depending on the interconnect pattern and the interconnect density. Even in such a case, an accurate film thickness can be determined by preparing a plurality of spectrum groups corresponding to different interconnect patterns and different interconnect densities, comparing them with each sampling spectrum of the target wafer, and selecting an optimum spectrum group. In particular, if a source of pulse light, such as a xenon flash lamp or the like, is used, a measurement area in one measuring operation can be small. Moreover, use of such light source can make it possible to increase the frequency with which interconnect patterns and interconnect densities contained in respective measurement areas are uniformized, thus making it easy to determine a more accurate film thickness.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a polishing method and a polishing apparatus for polishing a substrate, such as a wafer or the like, while measuring a film thickness thereof on the basis of optical information contained in reflected light from the substrate.

REFERENCE SIGNS LIST 1 polishing pad
1a polishing surface
3 polishing table
3a table shaft
5 polishing head
6 carrier
7 elastic membrane
7a partition wall
8 retainer ring
9 elastic membrane
10 polishing-liquid supply nozzle
12 polishing controller
16 polishing head shaft
17 coupling device
18 polishing head motor
19 table motor
20 elevating mechanism
25 optical film-thickness measuring device
31 film thickness sensor
32 processor
42 light emitter
43 light receiver (optical fiber)
44 spectrometer
47 light source
48 optical fiber
50A first hole
50B second hole
51 through-hole
53 liquid supply passage
54 liquid discharge passage
55 liquid supply source
58 storage device
60 data server
61 spectrum group database
62 spectrum group selection history database
70 polishing apparatus
D1, D2, D3, D4 pressure chamber
G1, G2, G3, G4 fluid line
U1, U2, U3, U4 vacuum line

The invention claimed is:

1. A polishing method comprising:
preparing a plurality of spectrum groups each containing a plurality of reference spectra corresponding to different film thicknesses;
directing light to a substrate and receiving reflected light from the substrate;
producing, from the reflected light, a sampling spectrum for selecting a spectrum group;
selecting a spectrum group containing a reference spectrum which is closest in shape to the sampling spectrum;
producing a measurement spectrum for obtaining a film thickness while polishing the substrate;
selecting, from the selected spectrum group, a reference spectrum which is closest in shape to the measurement spectrum that has been produced when the substrate is being polished; and
obtaining a film thickness corresponding to the selected reference spectrum,
wherein the plurality of spectrum groups are stored in a database,
the database contains history information with respect to selection of the plurality of spectrum groups, and
based on the history information, deleting a spectrum group that has not been selected for a predetermined period of time from the database, or storing, as a new spectral group in the database, a data of a measurement point on the substrate, together with film thicknesses at the measurement point, wherein the film thicknesses have been measured by an inline film-thickness measuring unit before and after polishing of the substrate.

2. The polishing method according to claim 1, wherein selecting the spectrum group comprises selecting a spectrum group containing a reference spectrum with a smallest deviation from the sampling spectrum.

3. The polishing method according to claim 1, wherein selecting the spectrum group is carried out when the substrate is being polished.

4. The polishing method according to claim 3, wherein selecting the spectrum group is carried out using the sampling spectrum which has been produced within a preset polishing time.

5. The polishing method according to claim 1, wherein selecting the spectrum group is carried out before the substrate is polished.

6. The polishing method according to claim 5, wherein selecting the spectrum group is carried out when the substrate is being water-polished in a presence of pure water existing between the substrate and a polishing pad.

7. The polishing method according to claim 1, further comprising:

reproducing a sampling spectrum while polishing the substrate; and reselecting a spectrum group containing a reference spectrum which is closest in shape to the reproduced sampling spectrum, wherein selecting the reference spectrum comprises selecting, from the reselected spectrum group, a reference spectrum which is closest in shape to the measurement spectrum that has been produced when the substrate is being polished.

8. The polishing method according to claim 1, wherein the plurality of spectrum groups are obtained by:

directing light to a plurality of areas defined on a reference substrate having a same film thickness as or a larger film thickness than a film thickness of the substrate, while polishing the reference substrate;

producing a plurality of reference spectra from the light reflected from the plurality of areas; and classifying the plurality of reference spectra according to the plurality of areas.

9. The polishing method according to claim 8, further comprising:

preselecting spectrum groups obtained in areas near an area where the film thickness of the substrate is to be monitored.

10. The polishing method according to claim 1, wherein the plurality of spectrum groups are obtained by:

selecting one of a plurality of reference substrates each having a same film thickness as or a larger film thickness than a film thickness of the substrate;

directing light to the selected reference substrate while polishing the selected reference substrate;

obtaining one or more spectrum groups by producing a plurality of reference spectra from the light reflected from the reference substrate; and repeating the process of directing the light to the selected reference substrate and the process of obtaining one or more spectrum groups, while changing the reference substrate, to be selected, from one to another each time the repeating is performed.

11. The polishing method according to claim 1, wherein the plurality of reference spectra contained in each of the plurality of spectrum groups comprise spectra produced by a simulation of light reflection.

12. The polishing method according to claim 1, wherein the database is constructed in a date server, and the data server deletes a spectrum group that has not been selected for a predetermined period of time from the database based on the history information, or stores a data of a measurement point on the substrate, together with film thicknesses at the measurement point that have been measured by an inline film-thickness measuring unit before and after polishing of the substrate, as a new spectral group in the database.

13. The polishing method according to claim 1, wherein the database is a database common to a plurality of polishing apparatuses.

14. A polishing method comprising:

preparing a plurality of spectrum groups each containing a plurality of reference spectra corresponding to different film thicknesses;

directing light to a substrate and receiving reflected light from the substrate;

producing, from the reflected light, a sampling spectrum for selecting a spectrum group;

selecting a spectrum group containing a reference spectrum which is closest in shape to the sampling spectrum;

producing a measurement spectrum for obtaining a film thickness while polishing the substrate;

selecting, from the selected spectrum group, a reference spectrum which is closest in shape to the measurement spectrum that has been produced when the substrate is being polished;

obtaining a film thickness corresponding to the selected reference spectrum; and excluding in advance, from the plurality of spectrum groups, one of spectrum groups containing reference spectra which are close in shape to each other.

15. A polishing method comprising:

obtaining at least one spectrum group containing a plurality of reference spectra by polishing a reference substrate;

correcting the plurality of reference spectra such that a polishing rate of the reference substrate is regarded as constant, thereby obtaining a plurality of corrected reference spectra corresponding to different film thicknesses;

directing light to a substrate and receiving reflected light from the substrate;

producing a measurement spectrum for obtaining a film thickness while polishing the substrate;

selecting, from the at least one spectrum group, a corrected reference spectrum which is closest in shape to the measurement spectrum that has been produced when the substrate is being polished; and obtaining a film thickness corresponding to the corrected reference spectrum selected.

* * * * *